(12) United States Patent
Shibuya

(10) Patent No.: US 10,056,332 B2
(45) Date of Patent: Aug. 21, 2018

(54) ELECTRONIC DEVICE WITH DELAMINATION RESISTANT WIRING BOARD

(71) Applicant: Renesas Electronics Corporation, Koutou-ku, Tokyo (JP)

(72) Inventor: Hiroki Shibuya, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/626,120

(22) Filed: Jun. 17, 2017

(65) Prior Publication Data

US 2018/0068942 A1 Mar. 8, 2018

(30) Foreign Application Priority Data

Sep. 5, 2016 (JP) .................................. 2016-172820
Feb. 6, 2017 (JP) .................................. 2017-019255

(51) Int. Cl.
*H01L 23/528* (2006.01)
*H01L 23/522* (2006.01)
*H01L 23/66* (2006.01)

(52) U.S. Cl.
CPC ........ *H01L 23/528* (2013.01); *H01L 23/5226* (2013.01); *H01L 23/66* (2013.01); *H01L 2223/6616* (2013.01); *H01L 2223/6677* (2013.01)

(58) Field of Classification Search
CPC ... H01L 23/528; H01L 23/66; H01L 23/5228; H01L 2223/6616; H01L 2223/6677
USPC ................................................. 257/773, 774
See application file for complete search history.

(56) References Cited

U.S. PATENT DOCUMENTS

| 5,662,816 | A | * | 9/1997 | Andry | ..................... | H01P 3/081 |
| | | | | | | 216/18 |
| 6,613,413 | B1 | * | 9/2003 | Japp | ......................... | H05K 3/38 |
| | | | | | | 174/255 |
| 7,312,530 | B2 | * | 12/2007 | Hashimoto | ............. | H01L 24/03 |
| | | | | | | 257/758 |
| 9,502,363 | B2 | * | 11/2016 | Vincent | .................. | H01L 24/02 |
| 9,705,363 | B2 | * | 7/2017 | Shibuya | ............... | H04B 5/0037 |

(Continued)

FOREIGN PATENT DOCUMENTS

| JP | H10-84059 | * | 3/1998 | ............. H01L 23/14 |
| JP | 2008-016630 A | | 1/2008 | |

(Continued)

OTHER PUBLICATIONS

Machine translation, Komorida, Japanese Pat. Pub. No. JP H10-84059, translation date: Mar. 24, 2018, Espacenet, all pages.*

(Continued)

*Primary Examiner* — Victoria K Hall
(74) *Attorney, Agent, or Firm* — Shapiro, Gabor and Rosenberger, PLLC

(57) ABSTRACT

This invention provides an electronic device with improved reliability. The electronic device has a wiring board with a back-surface ground pattern formed at the back surface of the board. The back-surface ground pattern is provided with a notch overlapping a region of an upper wiring layer at which a board member is exposed and which is encircled by a wide pattern, the notch permitting the release of water vapor from the region.

15 Claims, 23 Drawing Sheets

(56) References Cited

U.S. PATENT DOCUMENTS

| | | | | |
|---|---|---|---|---|
| 2002/0125572 A1* | 9/2002 | Yi | ............ | H01L 23/528 |
| | | | | 257/750 |
| 2007/0052092 A1* | 3/2007 | Kao | ............ | H01L 23/528 |
| | | | | 257/734 |
| 2007/0273030 A1* | 11/2007 | Yi | ............ | H01L 21/8221 |
| | | | | 257/758 |
| 2008/0000874 A1 | 1/2008 | Nakano | | |
| 2013/0105988 A1* | 5/2013 | Lee | ............ | H01L 23/13 |
| | | | | 257/774 |
| 2014/0329476 A1* | 11/2014 | Yamamichi | ............ | H04W 84/18 |
| | | | | 455/90.2 |
| 2015/0270233 A1* | 9/2015 | Vincent | ............ | H01L 24/02 |
| | | | | 257/773 |
| 2016/0156231 A1* | 6/2016 | Shibuya | ............ | H04B 5/0037 |
| | | | | 455/82 |

FOREIGN PATENT DOCUMENTS

| | | | | | |
|---|---|---|---|---|---|
| JP | 2008-112862 | * | 5/2008 | ............ | H05K 1/02 |
| JP | 2009-170563 A | | 7/2009 | | |
| WO | WO 2013/054596 | * | 4/2013 | ............ | H04B 1/40 |

OTHER PUBLICATIONS

Machine translation, Watanabe, WIPO Pat. Pub. No. WO 2013/054596, translation date: Mar. 24, 2018, Espacenet, all pages.*

Machine translation, Oguri, Japanese Pat. Pub. No. JP 2008-112862, translation date: Mar. 24, 2018, Espacenet, all pages.*

* cited by examiner

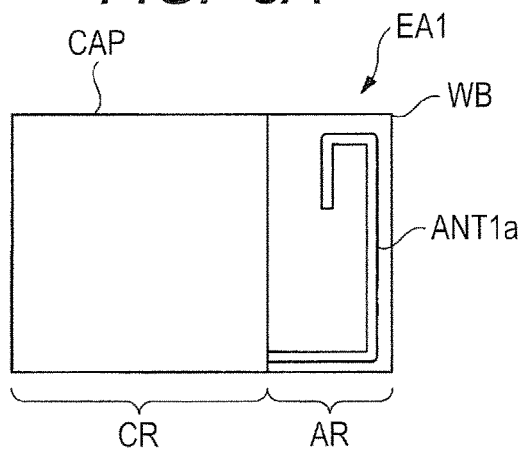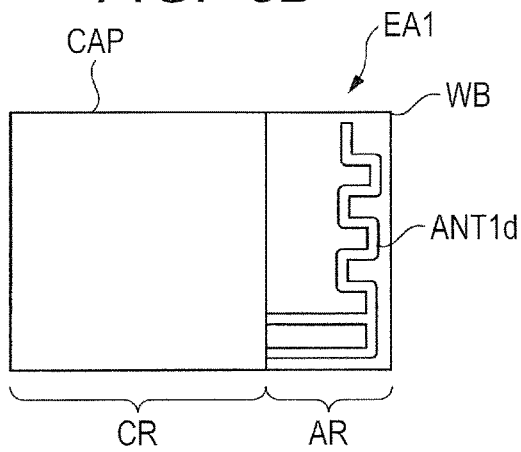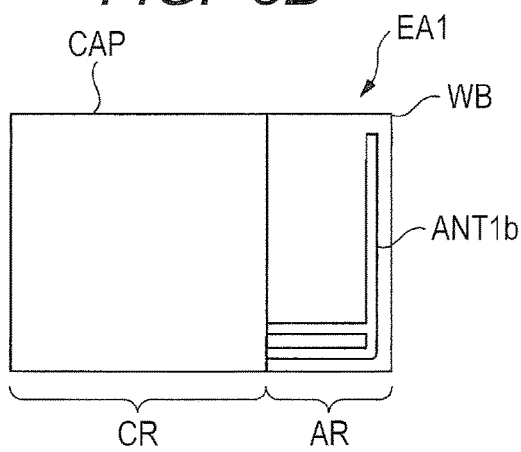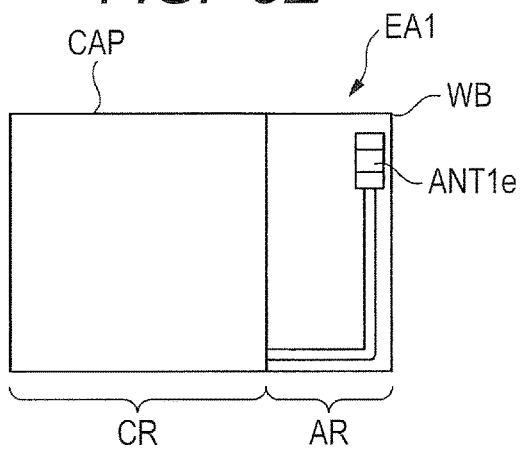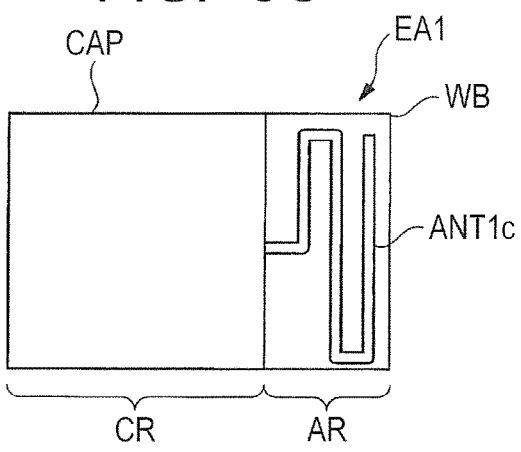

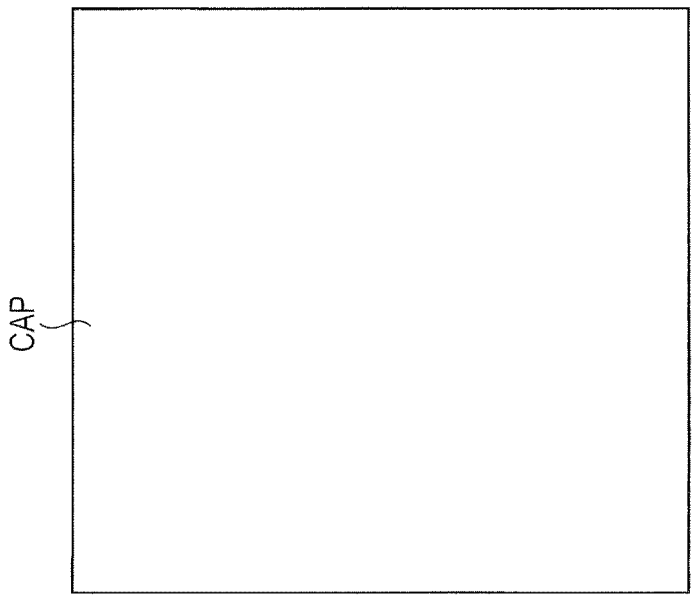
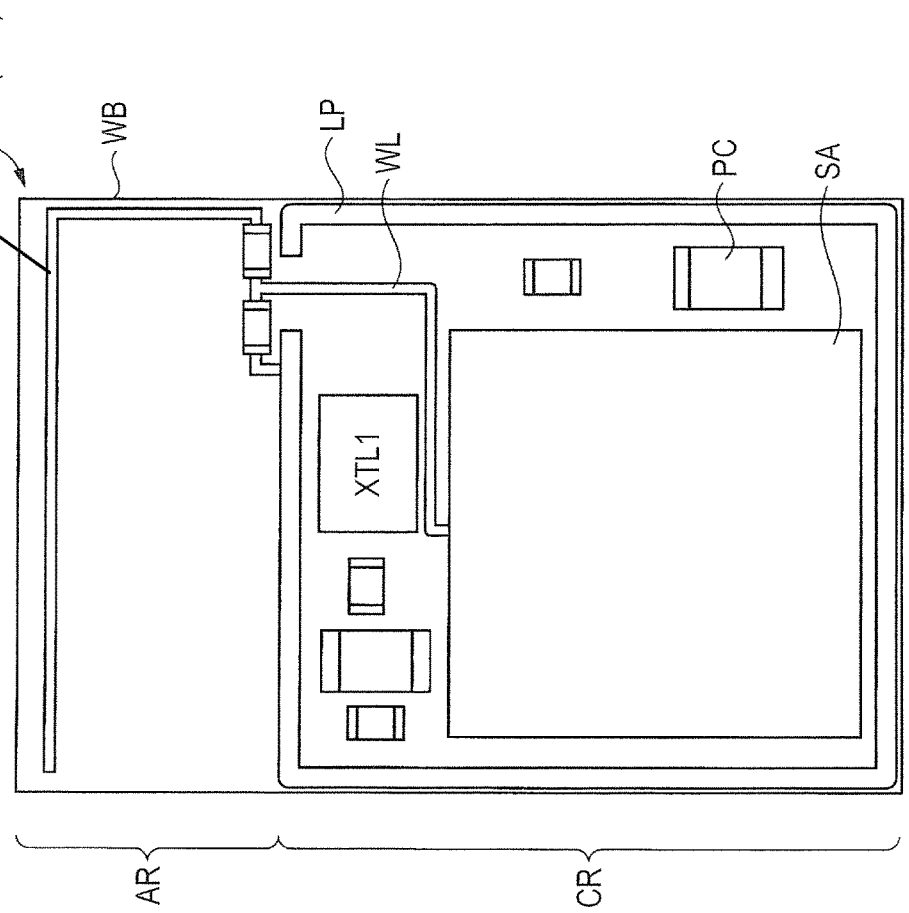

< INTERNAL WIRING LAYER L2 >

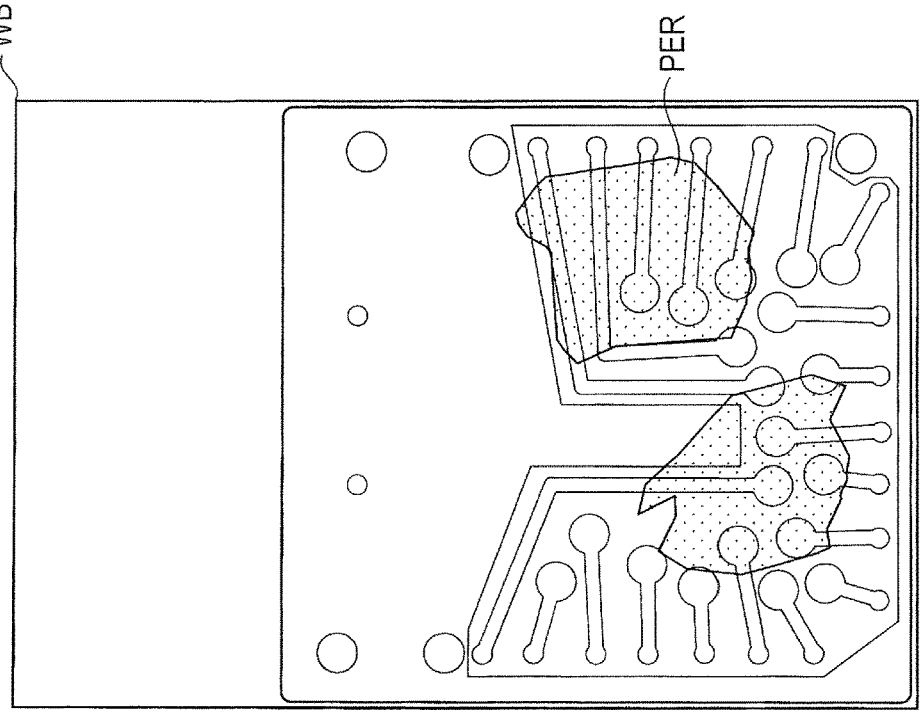
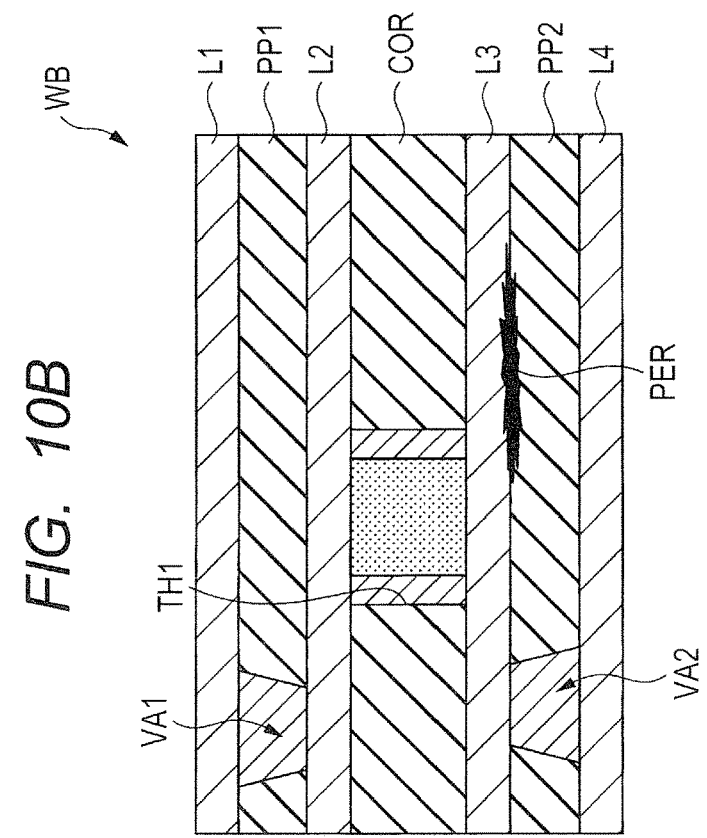
FIG. 10A
FIG. 10B

< FRONT SURFACE WIRING LAYER L1 >

< INTERNAL WIRING LAYER L2 >

< BACK SURFACE WIRING LAYER L4 >

< BACK SURFACE WIRING LAYER L4 >

< BACK SURFACE WIRING LAYER L4 >

ELECTRONIC DEVICE WITH DELAMINATION RESISTANT WIRING BOARD

CROSS-REFERENCE TO RELATED APPLICATIONS

The disclosures of Japanese Patent Application No. 2016-172820 filed on Sep. 5, 2016, and the disclosure of Japanese Patent Application No. 2017-019255 filed on Feb. 6, 2017 including the specification, drawings and abstract is incorporated herein by reference in its entirety.

BACKGROUND

This invention relates to electronic devices, and to an effective technique applied to an electronic device functioning as, for example, a wireless communication unit.

Japanese Unexamined Patent Application Publication No. 2008-16630 discloses a technique of dividing a conductor wiring layer formed over at a front surface of a wiring board in a grid-like fashion.

Japanese Unexamined Patent Application Publication No. 2009-170563 discloses a technique of forming an opening in a conductor pattern formed over a chip mounting face of a wiring board so that the opening reaches a substrate.

SUMMARY

For example, expectations are running high for the growth of the Internet of Things (IoT). A most promising major communication standard for the IoT is "Bluetooth (registered trademark) Low Energy" (hereinafter, referred to as BLE), and development of nodes with a "BLE module" and various "Things" combined is being actively made.

A node includes a "BLE module" composed of an electronic device having a wireless communication function, and the implementation of the "BLE module" capable of ensuring good communication quality is desired. The "BLE module" has been already applied to consumer products, but the application of "BLE module" to industrial products and in-car products which require higher reliability than that for the consumer products is in the early stages of consideration. Accordingly, the "BLE module" is required to have high reliability in order to maintain the communication quality even under harsh usage conditions.

Other problems and novel features of the present invention will become apparent from the following description in the specification and the accompanying drawings.

An electronic device according to an embodiment has a back-surface wide pattern that is formed at the back surface of a wiring board and is provided with notches from which a board member is exposed.

According to the embodiment, the electronic device can have improved reliability.

BRIEF DESCRIPTION OF THE DRAWINGS

FIG. 2A is a plan view showing the external configuration of the electronic device of the embodiment, while

FIGS. 3A to 3E show configuration examples of monopole antennas, respectively, that are formed in antenna mounting regions of wiring boards according to the embodiment.

FIG. 4A is a plan view showing the implementation configuration of electronic components mounted over a front surface of a wiring board, while FIG. 4B is a plan view of a cap mounted over the wiring board.

FIG. 10A is a plan view schematically showing a delaminated region where delamination has occurred, while FIG. 10B is a cross-sectional view schematically showing the delaminated region where the delamination has occurred.

DETAILED DESCRIPTION

Figure 1:
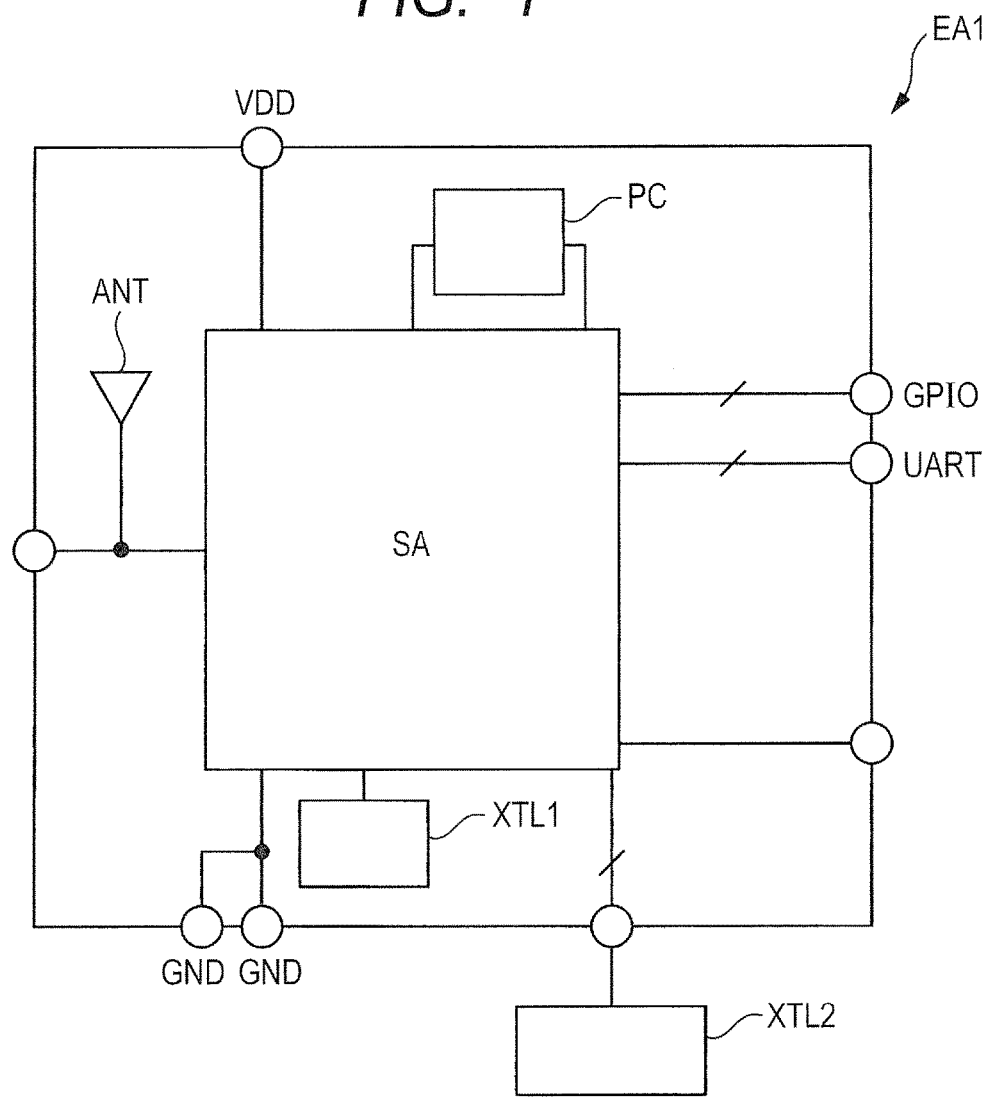
FIG. 1 is a circuit block diagram of an electronic device according to an embodiment.

In the following embodiment, if necessary for convenience, the embodiment will be divided into a plurality of sections or embodiments in the description; however, excepting the case that is particularly demonstrated, these are not independent of each other, but are in a relationship in which one is a variation(s) of part or all of the other, a detailed description, a supplementary description, or the like.

Also, in the following embodiment, when the number of elements and the like (including the number, the numeric value, the quantity, the range, and the like) are cited, excepting the case that is particularly demonstrated, the case in which the embodiment is clearly limited in principle to the particular number, and the like, the embodiment is not limited to the particular number, but the number may be more than or less than the particular number.

Additionally, in the following embodiment, the constituent components (including component steps and the like) are not necessarily required, excepting the case that is particularly demonstrated, the case in which the components are clearly required in principle, and the like.

Similarly, in the following embodiment, when contours, positional relationships, and the like of the constituent components are cited, excepting the case that is particularly demonstrated, the case in which the components are obviously inappropriate in principle, and the like, it is assumed that those substantially approximate to or analogous to the contours or the like are included. This is also applied to the numeric value and the range described above.

Moreover, in all the drawings to describe the embodiment, the same reference numerals are assigned to the same members in principle, and explanations thereof will not be repeated. Note that hatching may be sometimes used even in a plan view so as to make the drawings easy to see.

Circuit Block Configuration of Electronic Device

The node used for the IoT includes a "BLE module" functioning as a wireless communication unit. The "BLE module" is an electronic device, and the following description shows a circuit block configuration of an electronic device functioning as a wireless communication unit of a node.

FIG. 1 is a circuit block diagram of an electronic device EA1 according to an embodiment. As shown in FIG. 1, the electronic device EA1 of the embodiment includes a semiconductor device SA having a semiconductor chip in which a RFIC is formed and a semiconductor chip in which a microcomputer is formed, and this semiconductor device SA functions as the heart of the wireless communication unit. The electronic device EA1 of the embodiment has a power supply terminal VDD and ground terminals GND, and the power supply terminal VDD and ground terminals GND are electrically coupled to the semiconductor device SA. The electrically coupled terminals enable supply of a power supply potential and a reference potential to the semiconductor device SA, thereby operating the semiconductor device SA. In addition, the electronic device EA1 of the embodiment incorporates an oscillator XTL1 that generates a reference clock of, for example, 32 MHz. This oscillator XTL1 is electrically coupled to the semiconductor device SA, and supplies the reference clock generated by the oscillator XTL1 to the semiconductor device SA. The semiconductor device SA performs the wireless communication function based on the reference clock. To make the electronic device EA1 smaller, an oscillator XTL2 generating a reference clock of, for example, 32.768 kHz is provided outside the electronic device EA; however, the oscillator XTL2 can be built in the electronic device EA1. Furthermore, the electronic device EA1 of the embodiment includes a passive component PC that is coupled to the semiconductor device SA and composed of an inductor and a capacitor, and also includes a general port GPIO, a communication terminal UART, and an antenna ANT that are electrically coupled to the semiconductor device SA. The electronic device EA1 according to the embodiment is configured as described above.

External Configuration of Electronic Device

Figure 2A:
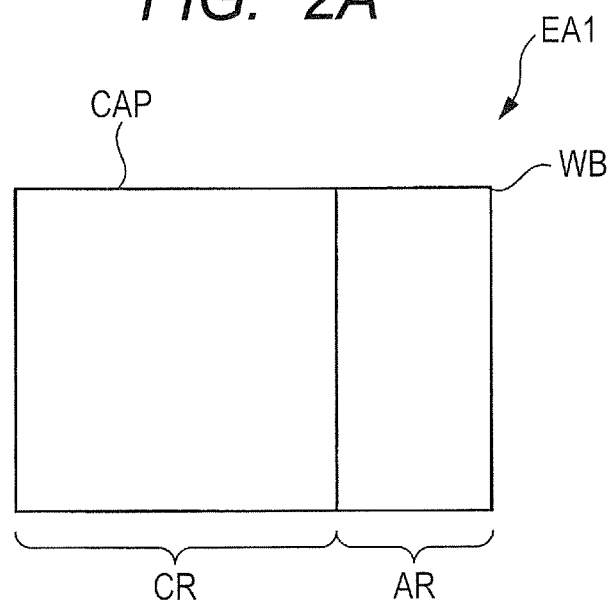
Figure 2B:
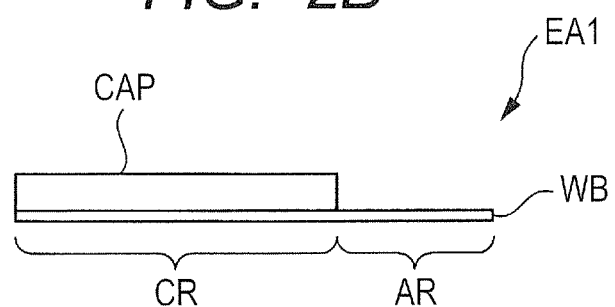
FIG. 2B is a side view showing the external configuration of the electronic device of the embodiment.

Next, the external configuration of the electronic device EA1 according to the embodiment will be described. FIG. 2A is a plan view showing the external configuration of the electronic device EA1 of the embodiment, while FIG. 2B is a side view showing the external configuration of the electronic device EA1 of the embodiment. As shown in FIGS. 2A and 2B, the electronic device EA1 of the embodiment has a wiring board WB which is rectangular in plan view. As shown in FIGS. 2A and 2B, this wiring board WB includes an antenna mounting region AR where an antenna (not shown) is mounted and a component mounting region CR adjacent to the antenna mounting region AR, and a cap CAP, which is rectangular in plan view, is provided so as to cover the component mounting region CR.

Utility of Monopole Antenna

As shown in FIG. 2A, the electronic device EA1 of the embodiment includes the wiring board WB where the antenna mounting region AR is formed, and an antenna is mounted in the antenna mounting region AR of the wiring board WB. This embodiment adopts a monopole antenna as the antenna ANT shown in FIG. 1 instead of a dipole antenna. This is because the use of the monopole antenna can downsize the electronic device EA1. Specifically, the electronic device EA1, which is a "BLE module", is desired to be smaller for incorporation into various "Things" in the IoT. Shrinking the electronic device EA1 enables incorporation of the electronic device EA serving as "BLE module" into small sized "Things".

From the viewpoint of miniaturization, the electronic device EA1 of the embodiment adopts a monopole antenna composed of a single antenna and a conductor pattern at ground potential (GND potential), instead of a dipole antenna requiring two antennas. However, it is generally said that the conductor pattern needs to be as large as possible to enhance the antenna characteristics of the monopole antenna. For the purpose of forming a larger conductor pattern in the component mounting region CR of the wiring board WB, the electronic device EA1 of the embodiment utilizes a plurality of wiring layers inside the wiring board WB to make the area of the conductor pattern to which a ground potential is applied larger, while making the electronic device EA1 smaller.

FIGS. 3A to 3E show monopole antennas ANT1$a$ to ANT1$e$, respectively, that are formed in the antenna mounting region AR of the wiring board WB according to the embodiment. As shown in FIGS. 3A to 3D, the electronic device EA1 of the embodiment can be implemented with the monopole antennas ANT1$a$ to ANT1$d$ of various antenna patterns, and can be also implemented with the monopole antenna ANT1$e$ that is a chip antenna.

Discussion of the Related Art

Description is now changed to the related art the inventors of the present invention reviewed. After describing some points that should be improved in the related art, we will explain the technical idea of the present embodiment that ameliorates the related art.

FIG. 4A is a plan view showing the implementation configuration of electronic components mounted over a front surface of a wiring board WB, while FIG. 4B is a plan view of a cap CAP mounted over the wiring board WB.

The electronic device EA according to the related art is, for example, a "BLE module" that functions as a wireless communication unit applicable to various "Things". As shown in FIG. 4A, the electronic device EA of the related art includes a wiring board WB that is rectangular in plan view. The front surface of the wiring board WB includes an antenna mounting region AR where a monopole antenna ANT1 is mounted and a component mounting region CR adjacent to the antenna mounting region AR.

In the component mounting region CR of the wiring board WB, a semiconductor device SA, an oscillator XTL1, a passive component PC, and some other components are mounted. Also, in the component mounting region CR of the wiring board WB, a cap-mount land pattern LP is formed along an outer area of the component mounting region CR, and the cap CAP that is placed so as to cover the semiconductor device SA is designed to be connectable to the cap-mount land pattern LP. This cap CAP is made of, for example, a metal material. The monopole antenna ANT1 formed in the antenna mounting region AR is electrically coupled to a wiring line WL formed in the component mounting region CR.

Figure 5:
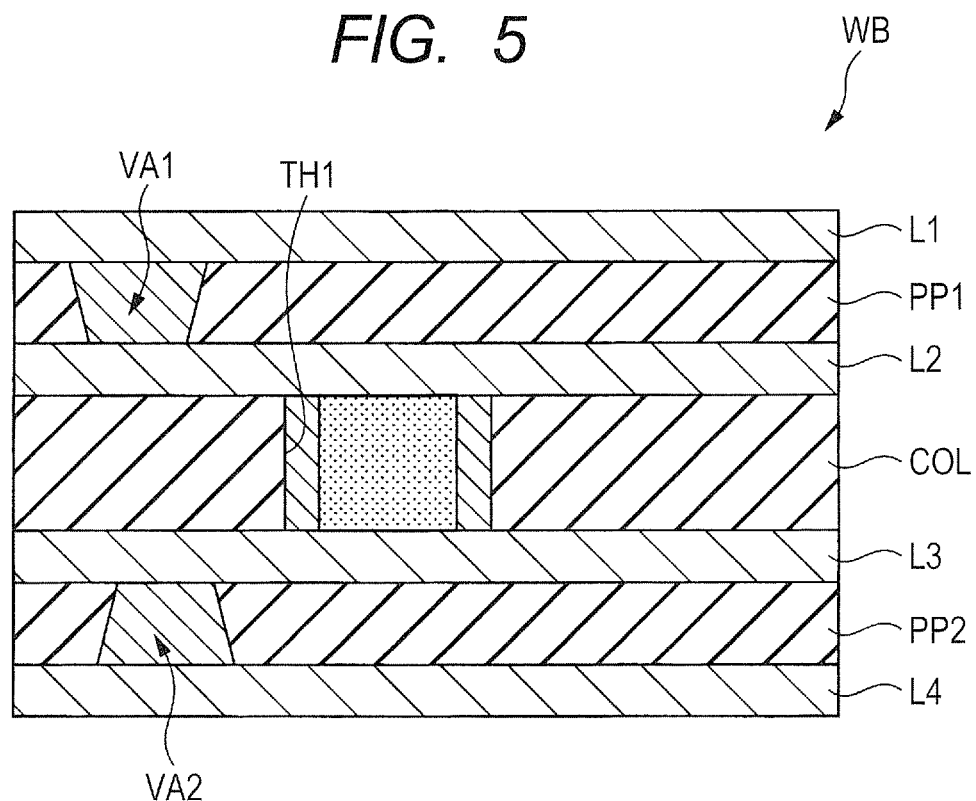
FIG. 5 schematically illustrates a cross section structure of the wiring board.

FIG. 5 shows a schematic cross section structure of the wiring board WB. As shown in FIG. 5, the wiring board WB is a multilayer interconnection board composed of, for example, four layers. Specifically, the wiring board WB has a laminated structure composed of a prepreg PP1, a core layer COL, and a prepreg PP2, those of which are made of an insulating material. The wiring board WB includes a front surface wiring layer L1 formed over the front surface of the prepreg PP1, an internal wiring layer L2 interposed between the prepreg PP1 and the core layer COL, an internal wiring layer L3 interposed between the core layer COL and prepreg PP2, and a back surface wiring layer L4 formed over the back surface of the prepreg PP2. As shown in FIG. 5, the front surface wiring layer L1 and internal wiring layer L2 are electrically coupled to each other through a via VA1 passing through the prepreg PP1. The internal wiring layer L2 and internal wiring layer L3 are electrically coupled to each other through a through hole TH1 passing through the core layer COL. Furthermore, the internal wiring layer L3 and back surface wiring layer L4 are electrically coupled to each other through a via VA2 passing through the prepreg PP2.

The following describes example plan layout configurations of the front surface wiring layer L1, internal wiring layer L2, internal wiring layer L3, and back surface wiring layer L4.

Figure 6:
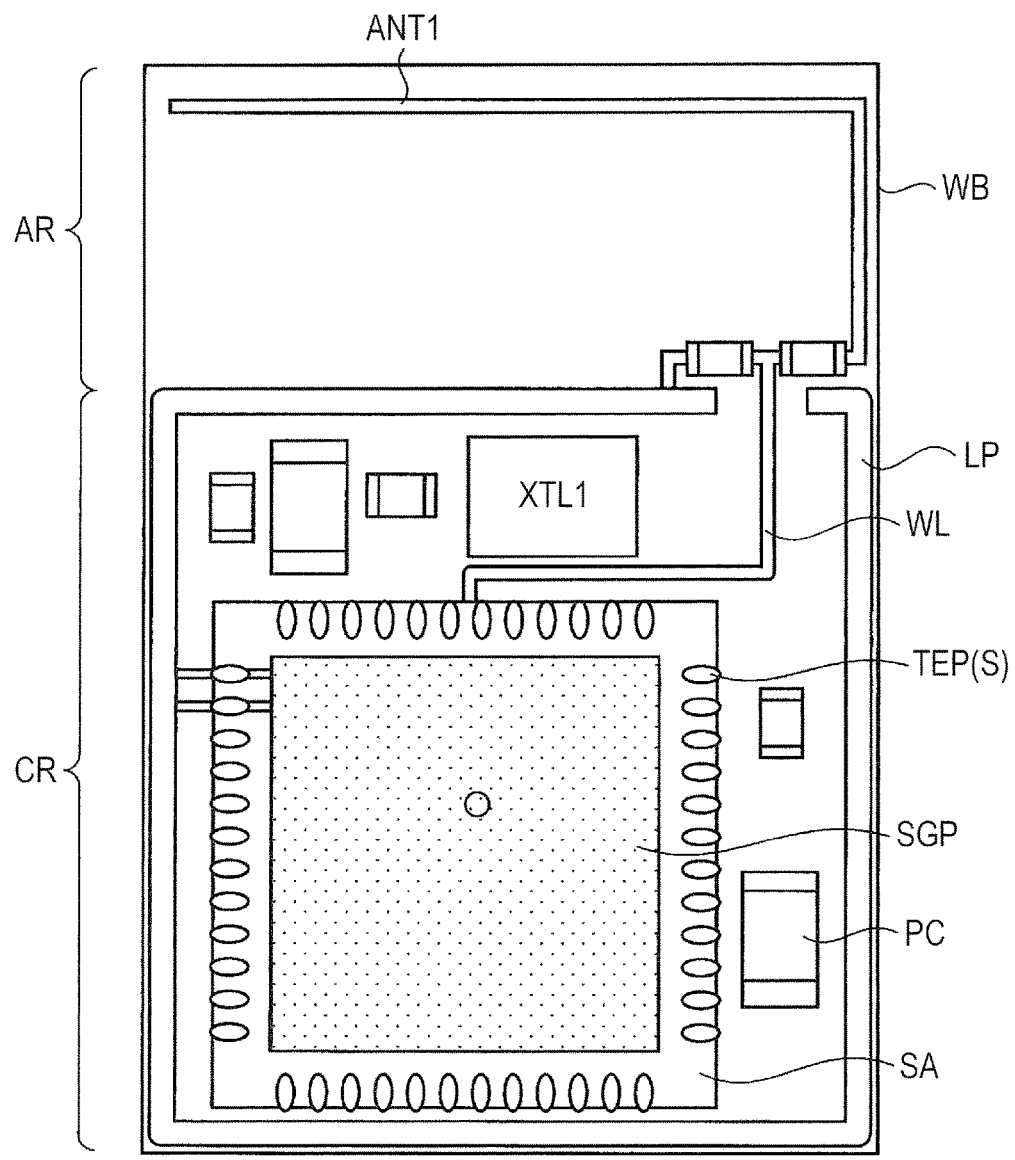
FIG. 6 is a plan view including a schematic plan layout configuration of a front surface wiring layer formed over the front surface of the wiring board.

FIG. 6 is a plan view including a schematic plan layout configuration of the front surface wiring layer L1 formed at the front surface of the wiring board WB. Specifically, FIG. 6 shows an example configuration of the front surface wiring layer L1 that appears by removing the semiconductor device SA shown in FIG. 4A. As shown in FIG. 6, a rectangular front-surface ground pattern SGP making up the front surface wiring layer L1, and a plurality of front-surface terminal patterns TEP(S) are formed at the front surface of the wiring board WB. The front-surface terminal patterns TEP(S) are arranged away from and around the front-surface ground pattern (front-surface wide pattern) SGP. The semiconductor device SA shown in FIG. 4A is mounted over the front surface of the wiring board WB so as to be electrically coupled to the front-surface ground pattern SGP and front-surface terminal patterns TEP (S). In addition, as shown in FIG. 6, the cap-mount land pattern LP formed along the outer area of the component mounting region CR is also a part of the front surface wiring layer L1 of the wiring board WB. The front-surface ground pattern SGP and cap-mount land pattern LP are electrically coupled to each other, and a ground potential (reference potential) is applied to both of them. Furthermore, as shown in FIG. 6, the monopole antenna ANT1 formed in the antenna mounting region AR is a wiring pattern that is also a part of the front surface wiring layer L1. This monopole antenna ANT1 is electrically coupled to the front-surface terminal patterns TEP(S) formed in the component mounting region CR through the wiring line WL that is a part of the front surface wiring layer L1.

Figure 7:
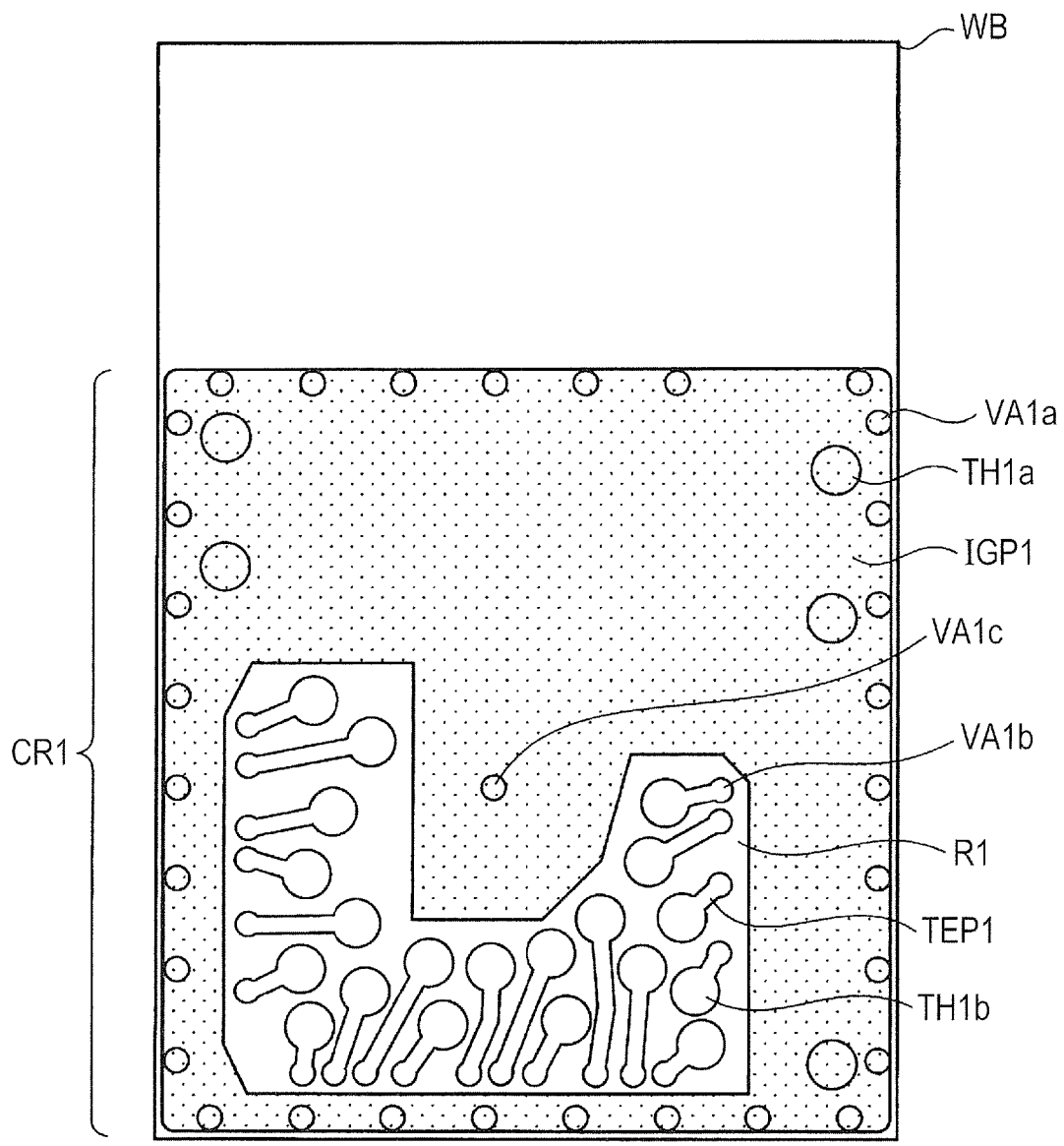
FIG. 7 is a plan view showing a schematic plan layout configuration of a first internal wiring layer.

FIG. 7 is a plan view showing a schematic plan layout configuration of the internal wiring layer L2. A region CR1 shown in FIG. 7 lies over the component mounting region CR shown in FIG. 6 in plan view, and an internal ground pattern (internal wide pattern) IGP1 to which a ground potential is applied is formed throughout most of the region CR1. The internal ground pattern IGP1 is electrically coupled to the cap-mount land pattern LP shown in FIG. 6 through a plurality of vias VA1$a$ disposed along an outer area of the region CR1, as well as the internal ground pattern IGP1 is electrically coupled to the front-surface ground pattern SGP shown in FIG. 6 through a via VA1$c$. In addition, the internal ground pattern IGP1 is electrically coupled to a plurality of through holes TH1$a$.

As shown in FIG. 7, the internal ground pattern IGP1 is formed so as to enclose a region R1 in plan view, that exposes a boardmember (insulating member). In the region R1 enclosed by the internal ground pattern IGP1, a plurality of internal terminal patterns TEP1 are formed. Each of the internal terminal patterns TEP1 has an end electrically coupled to a via VA1$b$. Consequently, the internal terminal patterns TEP1 formed in the internal wiring layer L2 shown in FIG. 7 are electrically coupled to the front-surface terminal patterns TEP(S) formed in the front surface wiring layer L1 shown in FIG. 6 through the vias VA1$b$. The other ends of the internal terminal patterns TEP1 are electrically coupled to through holes TH1$b$ on a one-on-one basis.

Figure 8:
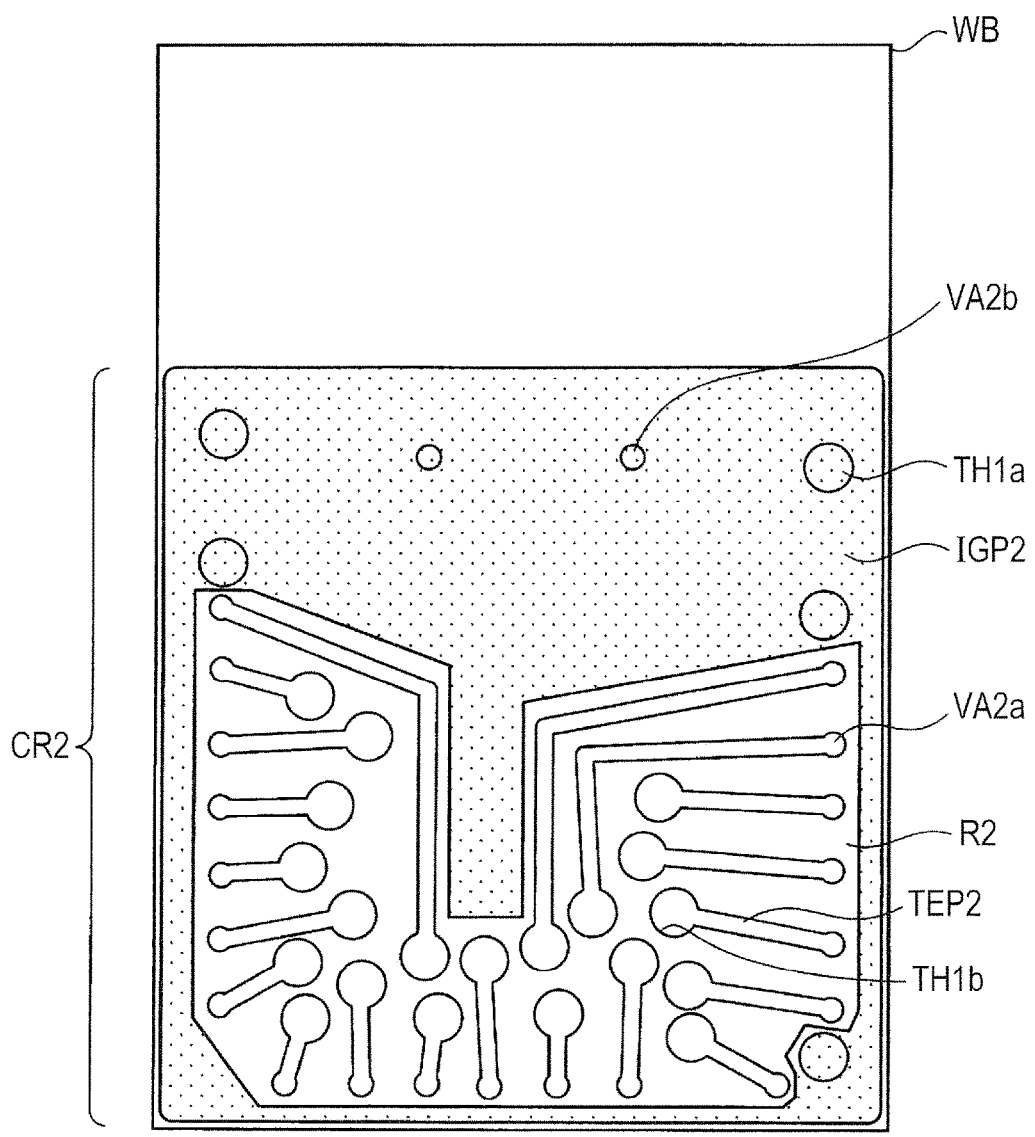
FIG. 8 is a plan view showing a schematic plan layout configuration of a second internal wiring layer.

FIG. 8 is a plan view showing a schematic plan layout configuration of the internal wiring layer L3. A region CR2 shown in FIG. 8 lies over the component mounting region CR shown in FIG. 6 in plan view, and an internal ground pattern (internal wide pattern) IGP2 to which a ground potential is applied is formed in the region CR2. In addition, the internal ground pattern IGP2 is electrically coupled to the through holes TH1$a$. Accordingly, the internal ground pattern IGP1 formed in the internal wiring layer L2 shown in FIG. 7 is electrically coupled to the internal ground pattern IGP2 formed in the internal wiring layer L3 shown in FIG. 8 through the through holes TH1$a$. In addition, the internal ground pattern IGP2 is electrically coupled to vias VA2$b$. As shown in FIG. 8, the internal ground pattern IGP2 is formed so as to enclose a region R2 in plan view, that exposes a board member (insulating member). In the region R2 enclosed by the internal ground pattern IGP2, a plurality of internal terminal patterns TEP2 are formed. Each of the internal terminal patterns TEP2 has one end electrically coupled to a via VA2$a$, and the other end is electrically coupled to each of the through holes TH1$b$. Consequently, the internal terminal patterns TEP1 formed in the internal wiring layer L2 shown in FIG. 7 are electrically coupled to the internal terminal patterns TEP2 formed in the internal wiring layer L2 shown in FIG. 8 through the through holes TH1$b$.

Figure 9:
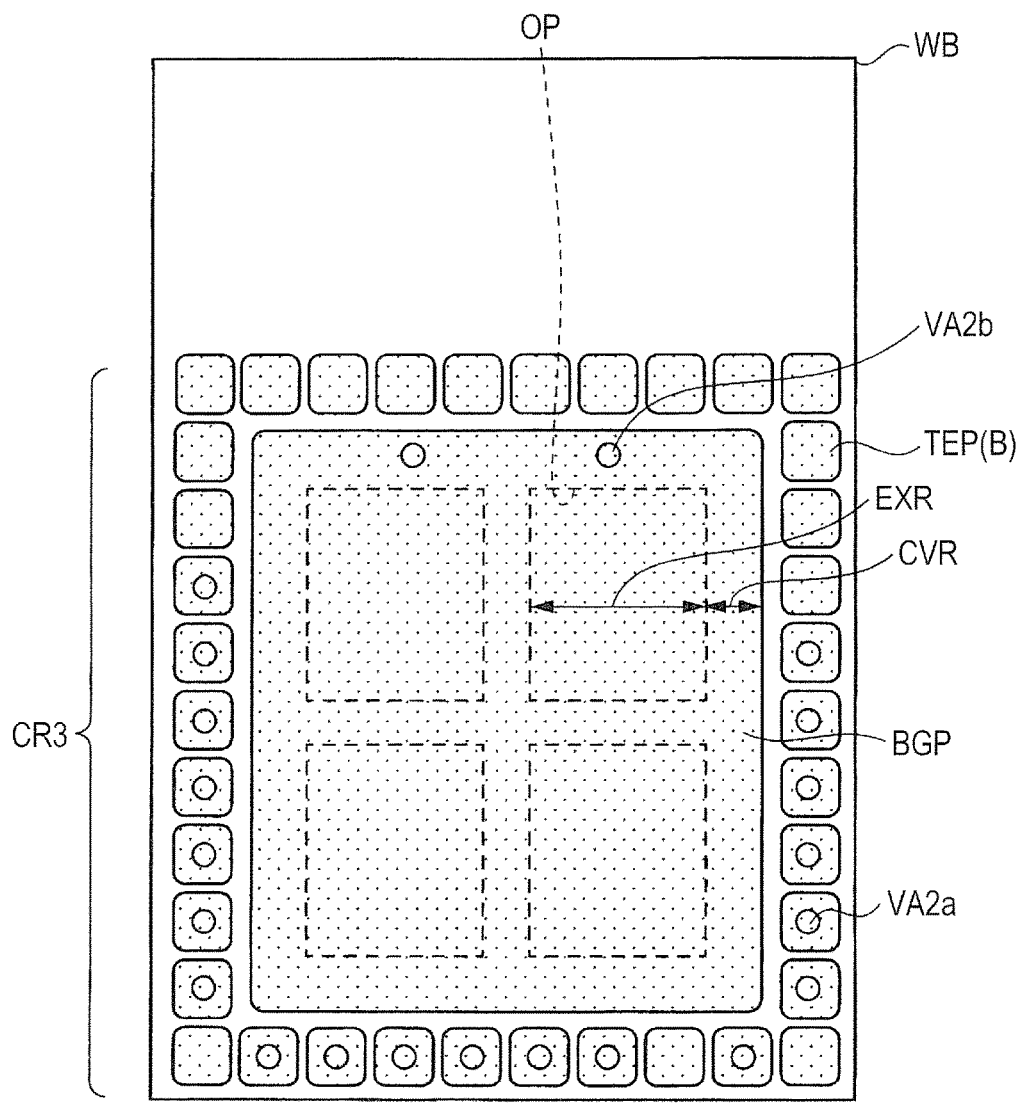
FIG. 9 is a plan view showing a schematic plan layout configuration of a back surface wiring layer.

FIG. 9 is a plan view showing a schematic plan layout configuration of the back surface wiring layer L4. A region CR3 shown in FIG. 9 lies over the component mounting region CR shown in FIG. 6 in plan view. In the region CR3, a back-surface ground pattern (back-surface wide pattern) BGP to which a ground potential is applied is formed. The back-surface ground pattern BGP is configured to include a covered region CVR that is covered with solder resist (not shown), and exposed regions EXR that are exposed from openings OP formed in the solder resist. The back-surface ground pattern BGP is electrically coupled to the vias VA2b. Accordingly, the back-surface ground pattern BGP formed in the back surface wiring layer L4 shown in FIG. 9 is electrically coupled to the internal ground pattern IGP2 formed in the internal wiring layer L3 shown in FIG. 8 through the vias VA2b.

In addition, a plurality of back-surface terminal patterns TEP(B) are formed away from and around the back-surface ground pattern BGP shown in FIG. 9. The back-surface terminal patterns TEP(B) are coupled to the vias VA2a. Accordingly, the back-surface terminal patterns TEP(B) formed in the back surface wiring layer L4 shown in FIG. 9 are electrically coupled to the internal terminal patterns TEP2 formed in the internal wiring layer L3 shown in FIG. 8 through the vias VA2a. Consequently, the front-surface terminal patterns TEP(S) formed in the front surface wiring layer L1 are electrically coupled to the back-surface terminal patterns TEP(B) formed in the back surface wiring layer L4 through the internal terminal patterns TEP1 formed in the internal wiring layer L2 and the internal terminal patterns TEP2 formed in the internal wiring layer L3.

Note that some of the front-surface terminal patterns TEP(S) are coupled to the passive component and some are coupled to each other, and therefore not all the front-surface terminal patterns TEP(S) are coupled to the back-surface terminal patterns TEP(B).

Study for Improvement

The present inventors have studied the electronic device EA of the related art as configured above, and newly found room for improvement as described below.

For example, the electronic device EA in the related art has already reached a quality level meeting a consumer product's quality standard; however, the growing spread of the IoT tends to expand the applications of future downsized "BLE modules". More specifically, the future "BLE modules" are being contemplated to find applications requiring high reliability, such as industrial applications and in-car applications. In this case, it can be expected that more stringent requirements for, for example, moisture resistance and heat resistance will be imposed on the electronic device composing the "BLE module", and the aforementioned electronic device EA in the related art may not be able to meet the quality standard for such high reliability. Especially, the study by the inventors points out that the electronic device EA in the related art has room for improvement in terms of moisture resistance and heat resistance. Specifically speaking, the moisture absorbed in the wiring board evaporates by application of heat. If the related art electronic device EA containing a large amount of moisture in the wiring board is exposed to high heat, the heat produces an internal-pressure rise region where there are few leak paths allowing evaporated moisture to escape to the outside, and consequently the wiring layers in the internal-pressure rise region are delaminated from the wiring board. This delamination makes it difficult to improve the reliability of the electronic device EA of the related art. The electronic device EA in the related art is designed based on the following first design concept, second design concept, and third design concept, which will be described later, and these concepts may cause the internal-pressure rise region that has few escape routes for evaporated moisture.

The first design concept is derived from the adoption of a monopole antenna to reduce the size of the electronic device EA. The monopole antenna uses a ground pattern that operates as an image antenna and receives a ground potential, and therefore the pattern design of the ground pattern formed in the electronic device EA has a profound effect on the RF characteristics. Especially, since increasing the area of the ground pattern leads to the characteristic improvement of the monopole antenna from a qualitative viewpoint, the related art electronic device EA adopts a design concept of forming a large area ground pattern in each of the wiring layers (front surface wiring layer L1, internal wiring layer L2, internal wiring layer L3, and back surface wiring layer L4) as shown in FIGS. 6 to 9. The adoption of the design concept resultantly causes increase of regions of the wiring layers covering the board materials (core layer COL, prepreg PP1, and prepreg PP2) sandwiched by the wiring layers.

While the large area ground patterns are formed, the second design concept requires electrically coupling the front-surface terminal patterns TEP(S) shown in FIG. 6 and the back-surface terminal patterns TEP(B) shown in FIG. 9. To that end, in the electronic device EA of the related art, firstly the internal terminal patterns TEP1, which are electrically coupled to the front-surface terminal patterns TEP(S) through the vias VA1b, are formed in the internal wiring layer L2, and, as shown in FIG. 7, the internal terminal patterns TEP1 are drawn inwardly. Secondly, the internal terminal patterns TEP2, which are electrically coupled to the internal terminal patterns TEP1 through the through holes TH1b, are formed in the internal wiring layer L3, and, as shown in FIG. 8, the internal terminal patterns TEP2 are drawn outwardly. The outwardly-drawn internal terminal patterns TEP2 are electrically coupled to the back-surface terminal patterns TEP (B) shown in FIG. 9 through the vias VA2a. According to the electronic device EA of the related art, the front-surface terminal patterns TEP(S) shown in FIG. 6 can be electrically coupled to the back-surface terminal patterns TEP(B) shown in FIG. 9 through the internal terminal patterns TEP1 shown in FIG. 7 and the internal terminal patterns TEP2 shown in FIG. 8.

Such a second design concept is adopted because of the underlying technical idea to downsize the electronic device. In other words, if no consideration is given to the downsizing of the electronic device, all layers under the front-surface ground pattern SGP in FIG. 6 can have wide ground patterns, and the internal terminal patterns that electrically couple the front-surface terminal patterns TEP(S) and back-surface terminal patterns TEP(B) can be all drawn outwardly. However, in this case, the size of the electronic device of course increases. This is why the internal terminal patterns TEP1 are formed so as to be drawn inwardly in the internal wiring layer L2 in FIG. 7, and then the internal terminal patterns TEP2 are formed so as to be drawn outwardly in the internal wiring layer L3 in FIG. 8, in the related art. In short, the related art adopts schemes to increase the area of the internal ground pattern IGP1, while reducing the size of the electronic device as much as possible.

In the internal wiring layer L2 in FIG. 7, for example, the internal ground pattern IGP1 has to be large, but needs to be electrically isolated from the internal terminal patterns TEP1, and therefore the region R1 enclosed by the internal ground pattern IGP1 is inevitably formed as shown in FIG. 7, and the internal terminal patterns TEP1 are formed inside the region R1. Likewise, in the internal wiring layer L3 in FIG. 8, for example, the internal ground pattern IGP2 has to be large, but needs to be electrically isolated from the internal terminal patterns TEP2, and therefore, the region R2 enclosed by the internal ground pattern IGP2 is inevitably formed as shown in FIG. 8, and the internal terminal patterns TEP2 are formed inside the region R2. The front-surface ground pattern SGP in FIG. 6 is formed above the region R1 in FIG. 7, and the back-surface ground pattern BGP in FIG. 9 is formed below the region R2 in FIG. 8. This implies that the region R1 in FIG. 7 and the region R2 in FIG. 8 are internal-pressure rise regions that have few escape routes for evaporated moisture. As described above, adopting both the first and second design concepts in the related art inevitably causes the region R1 in FIG. 7 and the region R2 in FIG. 8 to be internal-pressure rise regions that have few escape routes for evaporated moisture.

Furthermore, the related art adopts also the third design concept being different from the aforementioned first design concept. The third design concept also causes the region R1 in FIG. 7 and region R2 in FIG. 8 to be internal-pressure rise regions that have few escape routes for evaporated moisture. The reason will be described below. For example, as shown in FIG. 6, the cap-mount land pattern LP is formed along the outer area of the component mounting region CR in the front surface wiring layer L1, and is coupled to the cap CAP (see FIGS. 2A and 2B). The cap CAP functions as an electromagnetic shield and a modification prevention measure, and is secured to the wiring board WB using the cap-mount land pattern LP formed along the outer area of the component mounting region CR for the purpose of electrically coupling to the ground and obtaining packaging strength. To supply a ground potential to the cap CAP, the ground potential firstly needs to be supplied to the cap-mount land pattern LP formed along the outer area of the component mounting region CR. Under the circumstances, for example, the internal ground pattern IGP1 electrically coupled to the cap-mount land pattern LP is formed along an outer area of the region CR1 as shown in FIG. 7. Likewise, for example, the internal ground pattern IGP2 electrically coupled to the internal ground pattern IGP1 is also formed along an outer area of the region CR2 as shown in FIG. 8. The combination of the third design concept and second design concept turns the region R1 in FIG. 7 and region R2 in FIG. 8 into internal-pressure rise regions having few escape routes for evaporated water. As described above, the electronic device EA of the related art adopting the aforementioned first, second, and third design concepts resultantly produces the internal-pressure rise regions inside the wiring board WB, and has the wiring layers in the internal-pressure rise regions. Due to this reason, delamination of the wiring layers in the internal-pressure rise regions arising with evaporation of moisture absorbed in the board material by heat becomes obvious as a problem.

For example, FIGS. 10A and 10B show delaminated regions PER where delamination occurs, and particularly, as shown in FIG. 10B, delamination of the internal wiring layer L3 from the prepreg PP2 is an appreciable problem in the related art. This is probably because the region R2 in FIG. 8 has fewer escape routes for evaporated moisture than the region R1 in FIG. 7 due to the large-sized back-surface ground pattern BGP (see FIG. 9) formed below the region R2. To solve the problem, the present embodiment adds a scheme particularly to prevent delamination of the internal wiring layer L3 caused by evaporated moisture, while adopting the aforementioned first to third design concepts. The technical idea of the embodiment adopting the scheme will be described below.

Implementation Configuration of Electronic Device According to the Embodiment

First of all, a front surface wiring layer L1 formed at the front surface of a wiring board WB in this embodiment has the same schematic plan layout configuration as that of the related art shown in FIG. 6, and explanations thereof will not be repeated. This means that FIG. 6 shows not only the schematic plan layout configuration of the front surface wiring layer L1 according to the related art, but also the schematic plan layout configuration of the front surface wiring layer L1 according to the embodiment.

Figure 11:
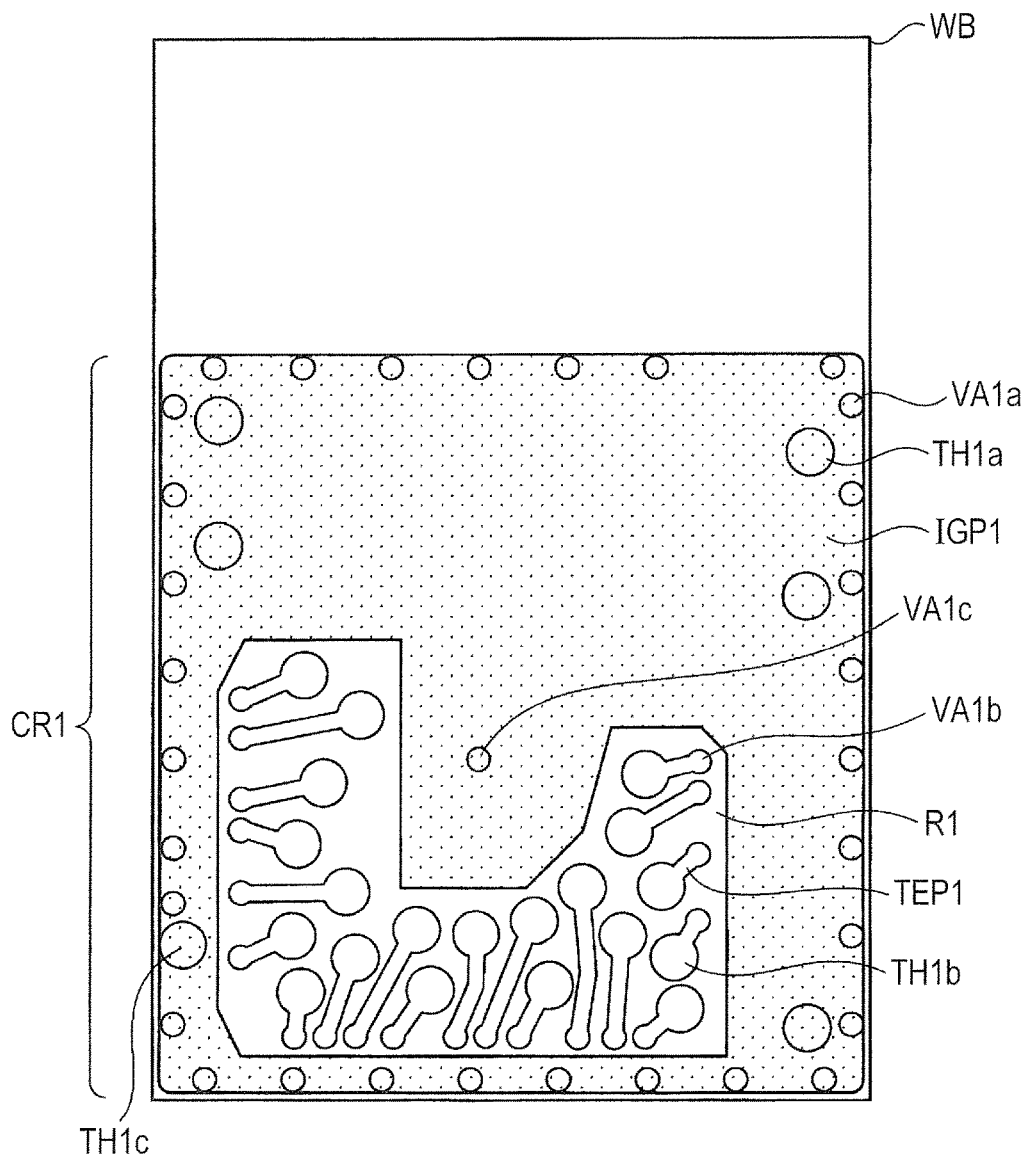
FIG. 11 is a plan view showing a schematic plan layout configuration of a first internal wiring layer according to the embodiment.

FIG. 11 is a plan view showing a schematic plan layout configuration of an internal wiring layer L2 according to the embodiment. A region CR1 shown in FIG. 11 lies over the component mounting region CR shown in FIG. 6 in plan view, and an internal ground pattern (internal wide pattern) IGP1 to which a ground potential is applied is formed throughout most of the region CR1. The internal ground pattern IGP1 is electrically coupled to the cap-mount land pattern LP shown in FIG. 6 through a plurality of vias VA1$a$ disposed along an outer area of the region CR1, as well as the internal ground pattern IGP1 is electrically coupled to the front-surface ground pattern SGP shown in FIG. 6 through a via VA1$c$. In addition, the internal ground pattern IGP1 in this embodiment is electrically coupled to through holes TH1$a$ and also to a through hole TH1$c$.

As shown in FIG. 11, the internal ground pattern IGP1 is formed so as to enclose a region R1, in plan view, that exposes a board member (insulating member). In the region R1 enclosed by the internal ground pattern IGP1, a plurality of internal terminal patterns TEP1 are formed. Each of the internal terminal patterns TEP1 has an end electrically coupled to a via VA1$b$. Consequently, the internal terminal patterns TEP1 formed in the internal wiring layer L2 shown in FIG. 7 are electrically coupled to the front-surface terminal patterns TEP(S) formed in the front surface wiring layer L1 shown in FIG. 6 through the vias VA1$b$. The other ends of the internal terminal patterns TEP1 are electrically coupled to through holes TH1$b$.

Figure 12:
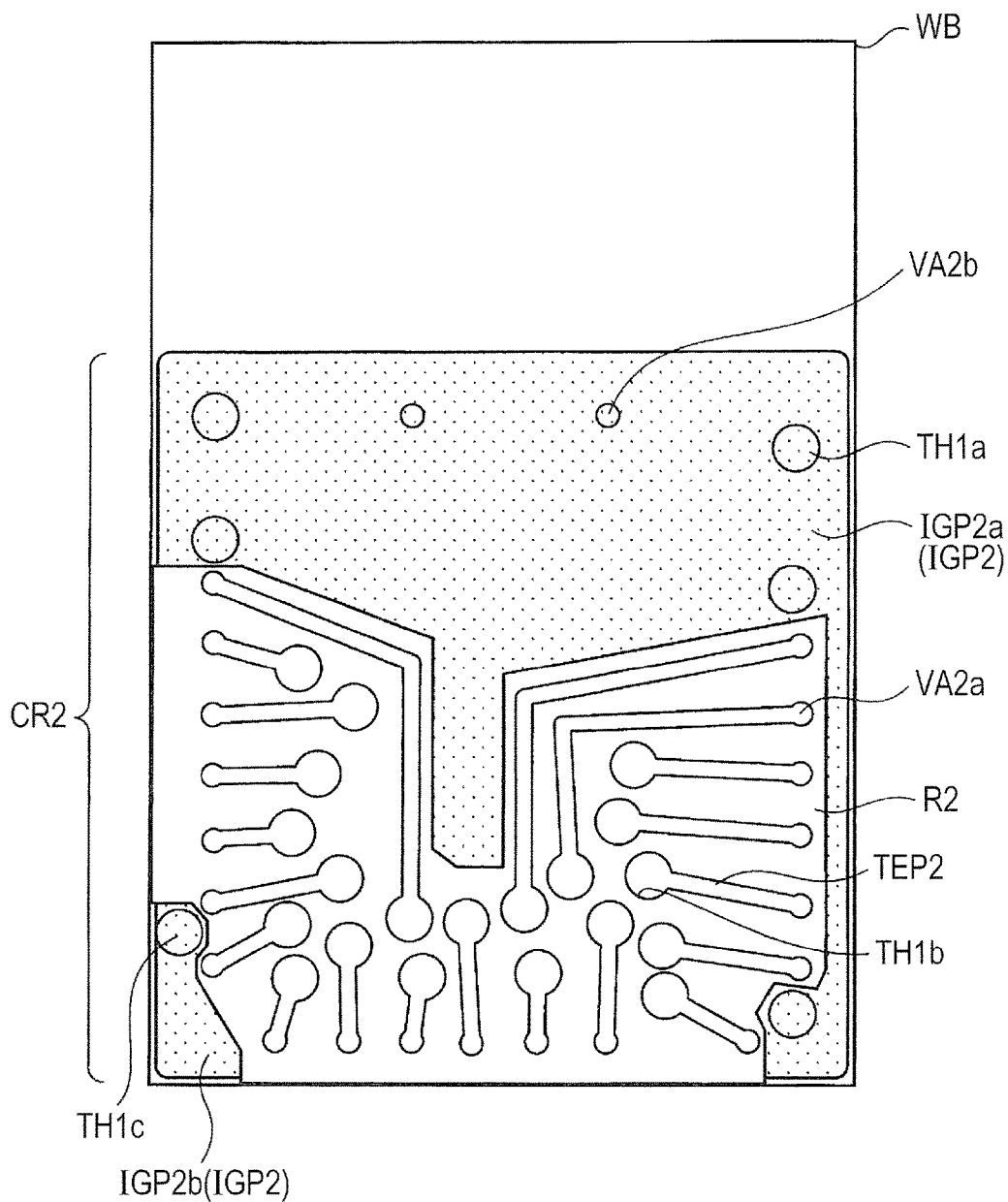
FIG. 12 is a plan view showing a schematic plan layout configuration of a second internal wiring layer according to the embodiment.

FIG. 12 is a plan view showing a schematic plan layout configuration of an internal wiring layer L3 according to the embodiment. A region CR2 shown in FIG. 11 lies over the component mounting region CR shown in FIG. 6 in plan view, and an internal ground pattern (internal wide pattern) IGP2 to which a ground potential is applied is formed in the region CR2. In addition, the internal ground pattern IGP2 is electrically coupled to the through holes TH1$a$ and TH1$c$. Accordingly, the internal ground pattern IGP1 formed in the internal wiring layer L2 shown in FIG. 11 is electrically coupled to the internal ground pattern IGP2 formed in the internal wiring layer L3 shown in FIG. 12 through the through holes TH1$a$. In addition, the internal ground pattern IGP2 is electrically coupled to vias VA2$b$. As shown in FIG. 12, the internal ground pattern IGP2 is divided into an internal ground pattern IGP2$a$ and an internal ground pattern IGP2$b$ by a region R2 that exposes the board member (insulating member). As shown in FIG. 12, the region R2 is so formed as to connect with side surfaces of the wiring board WB. A plurality of internal terminal patterns TEP2 are formed in the region R2 that divides the internal ground pattern IGP2. Each of the internal terminal patterns TEP2 has one end electrically coupled to a via VA2$a$, and the other end is electrically coupled to each of the through holes TH1$b$. Consequently, the internal terminal patterns TEP1 formed in the internal wiring layer L2 shown in FIG. 11 are electrically coupled to the internal terminal patterns TEP2 formed in the internal wiring layer L3 shown in FIG. 12 through the through holes TH1$b$.

Figure 13:
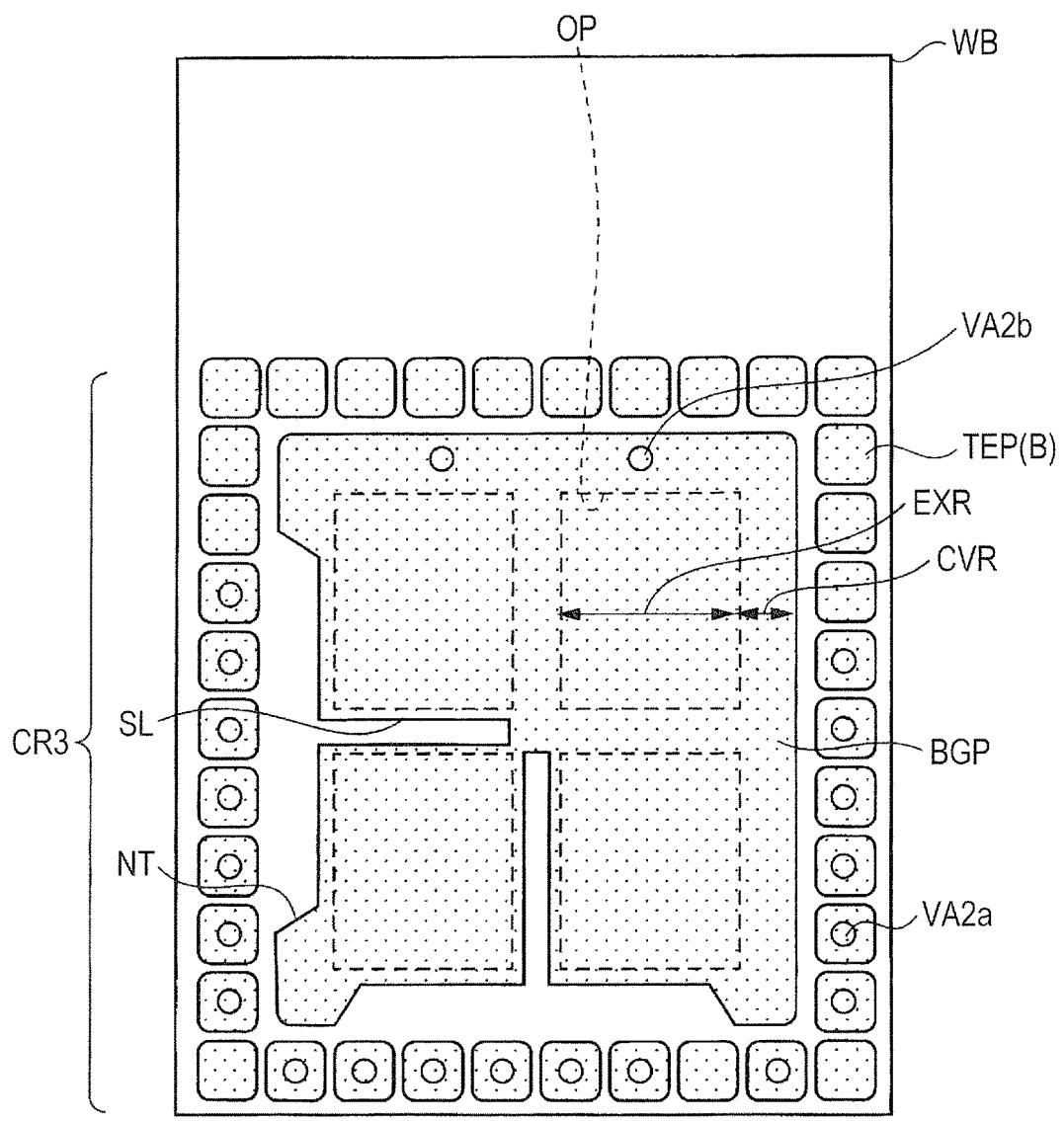
FIG. 13 is a plan view showing a schematic plan layout configuration of a back surface wiring layer according to the embodiment.

FIG. 13 is a plan view showing a schematic plan layout configuration of a back surface wiring layer L4 according to the embodiment. A region CR3 shown in FIG. 13 lies over the component mounting region CR shown in FIG. 6 in plan view. In the region CR3, a back-surface ground pattern (back-surface wide pattern) BGP to which a ground potential is applied is formed. The back-surface ground pattern BGP is configured to include a covered region CVR that is covered with solder resist (not shown) and exposed regions EXR that are exposed from openings OP formed in the solder resist. The back-surface ground pattern BGP is electrically coupled to the vias VA2b.

Accordingly, the back-surface ground pattern BGP formed in the back surface wiring layer L4 shown in FIG. 13 is electrically coupled to the internal ground pattern IGP2 formed in the internal wiring layer L3 shown in FIG. 12 through the vias VA2b. Furthermore, as can be seen from the combination of FIGS. 12 and 13, the back surface wiring layer L4 in this embodiment has the back-surface ground pattern BGP that overlaps with the region R2 and internal ground pattern IGP2a in plan view, and the back-surface ground pattern BGP has a plurality of notches NT that overlap with the region R2 in plan view and expose a board member. In such a back-surface ground pattern BGP, as shown in FIG. 13, there exists the covered region CVR between the notches NT and exposed regions EXR. The back-surface ground pattern BGP also has a plurality of slits SL that are formed in the covered region CVR sandwiched between the exposed regions EXR in plan view and expose the board material. The slits SL are connected to the notches NT.

A plurality of back-surface terminal patterns TEP (B) are formed away from and around the back-surface ground pattern BGP. The back-surface terminal patterns TEP(B) are coupled to the vias VA2a. Accordingly, the back-surface terminal patterns TEP (B) formed in the back surface wiring layer L4 shown in FIG. 13 are electrically coupled to the internal terminal patterns TEP2 formed in the internal wiring layer L3 shown in FIG. 12 through the vias VA2a. Consequently, the front-surface terminal patterns TEP(S) formed in the front surface wiring layer L1 are electrically coupled to the back-surface terminal patterns TEP (B) formed in the back surface wiring layer L4 through the internal terminal patterns TEP1 formed in the internal wiring layer L2 and the internal terminal patterns TEP2 formed in the internal wiring layer L3.

As can be seen with reference to FIGS. 6, 11, 12, 13, the front-surface ground pattern SGP, internal ground pattern IGP1, internal ground pattern IGP2, and back-surface ground pattern BGP are so formed as to overlap with the component mounting region CR in plan view. The front-surface ground pattern SGP is electrically coupled to the internal ground pattern IGP1, the internal ground pattern IGP1 is electrically coupled to each of the parts of the internal ground pattern IGP2 divided by the region R2, and the internal ground pattern IGP2a is electrically coupled to the back-surface ground pattern BGP.

Features of the Embodiment

With reference to the drawings, the features of the embodiment will be described. The first feature of the embodiment is that the notches NT are formed in the back-surface ground pattern BGP so as to overlap with the region R2 of FIG. 12 in plan view and expose the board member, as shown, for example, in FIG. 13. According to the embodiment, moisture evaporated from the board material in the region R2 shown in FIG. 12 can be released from the notches NT formed in the back-surface ground pattern BGP. Thus, the first feature of the embodiment can curb the rise of internal pressure caused by evaporated moisture trapped inside the region R2, thereby preventing delamination of the internal wiring layer L3.

The first feature of the embodiment is derived from a technical idea that has been made to form leak paths for moisture trapped in the region R2 of FIG. 12, and embodies the technical idea with the notches NT formed in the back-surface ground pattern BGP overlapping with the region R2 of FIG. 12 in plan view. For example, if the back-surface ground pattern BGP is laid over the entire region R2 of FIG. 12 in plan view, the back-surface ground pattern BGP prevents release of moisture from the region R2 to the external space. As a result, the evaporated moisture is trapped in the region R2, and the trapped moisture raises the internal pressure in the region R2, thereby inducing delamination of the internal wiring layer L3.

Figure 14:
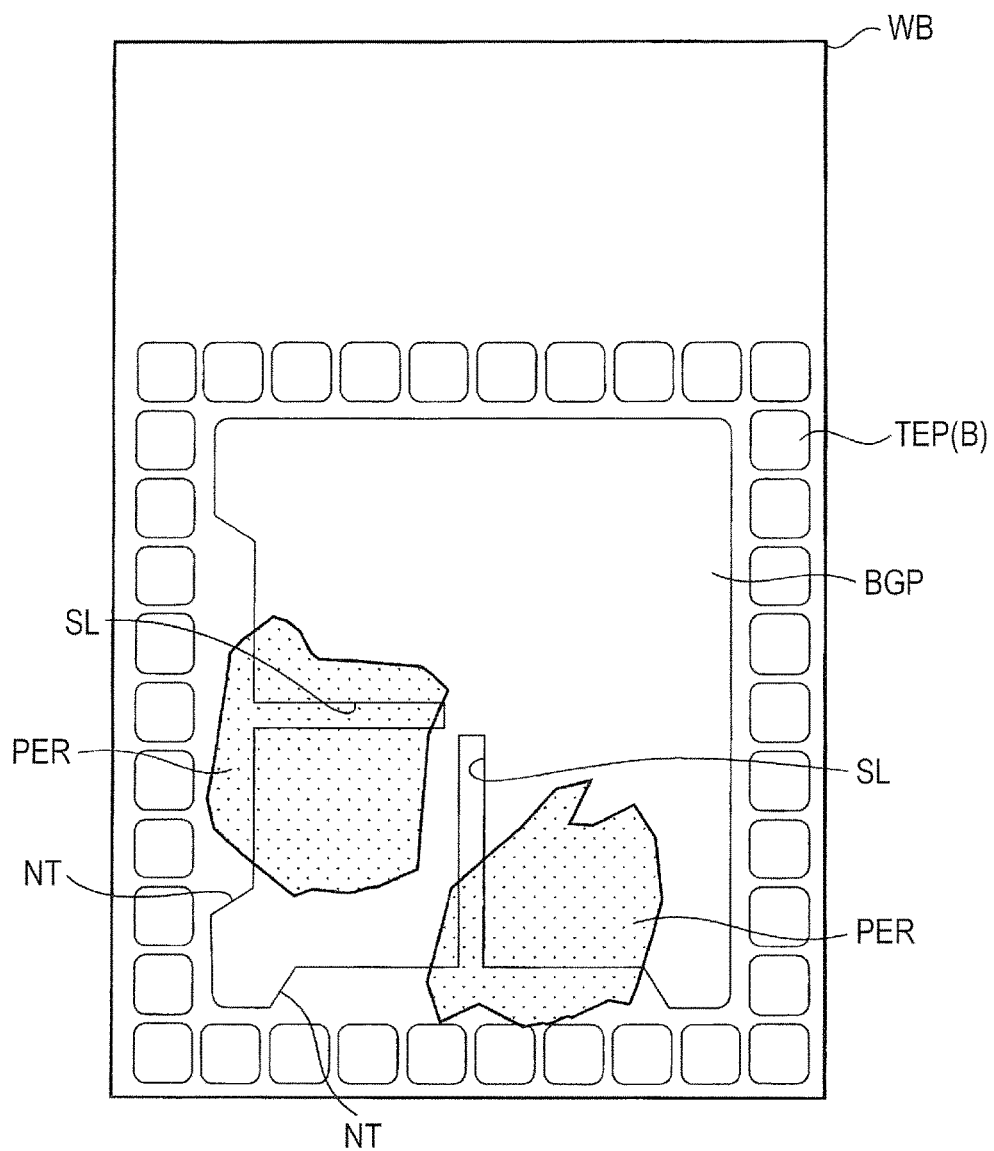
FIG. 14 is a schematic view showing the overlaps between a back-surface ground pattern having notches according to the embodiment and delaminated regions generated in related art.

To solve the problem, the first feature of the embodiment in which the notches NT are provided to part of the back-surface ground pattern BGP overlapping with the region R2 in plan view can form escape routes for evaporated moisture. Specifically, FIG. 14 schematically shows the overlaps between delaminated regions PER generated in the related art and the back-surface ground pattern BGP having the notches NT according to the embodiment. It is clear from FIG. 14 that the notches NT of the embodiment are formed at positions that overlap with the delaminated regions PER of the related art in plan view. Since the delaminated regions PER of the related art mean to be regions where evaporated moisture is trapped, the overlap of the notches NT of the embodiment with the delaminated regions PER implies that the notches NT effectively function as leak paths for evaporated moisture. Thus, according to the first feature of the embodiment, the notches NT can leak the evaporated moisture to the external space, and consequently, can reduce generation of the delaminated regions PER seen in the related art. In short, the technical significance of the first feature of the embodiment is not just providing notches NT to the back-surface ground pattern BGP, but is forming the notches NT so as to be positioned in regions that overlap in plan view with the region R2 where evaporated moisture is trapped, thereby allowing the notches NT to fully function as leak paths for evaporated moisture.

As described above, the first feature of the embodiment can effectively prevent delamination of the internal terminal patterns TEP2 formed in the region R2. Therefore, the first feature of the embodiment can improve the moisture resistance and heat resistance of the electronic device EA1, thereby increasing the reliability of the electronic device EA1. Especially, since the plurality of notches NT provided in the embodiment as shown, for example, in FIG. 13, can provide a plurality of leak paths for evaporated moisture in the region R2, delamination of the internal wiring layer L3 can be effectively prevented.

From the viewpoint of making the leak path larger, it is preferable to increase the size of the notches NT; however, notches NT larger than necessary may reduce the area of the back-surface ground pattern BGP and may cause the following disadvantages that should be kept in mind. For example, as shown in FIG. 13, the back-surface ground pattern BGP includes a covered region CVR that is covered with solder resist (not shown) and exposed regions EXR that are exposed from openings OP formed in the solder resist. If a notch NT is formed to reach an exposed region EXR, the notch NT exists as chipping in a ground terminal composed of the exposed region EXR of the back-surface ground pattern BGP, which induces a shape defect of the ground terminal. To prevent the shape defect, the notches NT in the embodiment are formed in the covered region CVR so as not to extend into the exposed regions EXR as shown in FIG. 13.

Thus, the embodiment can adopt the first feature, while preventing a shape defect from occurring in the ground terminal composed of the exposed regions EXR.

From the viewpoint of preventing a shape defect in the ground terminal composed of the exposed regions EXR, it is preferable not only to form the notches NT so as not to extend into the exposed regions EXR, but also to form the notches NT a fixed distance away from the exposed regions EXR. This is because the exposed regions EXR are formed by providing openings OP in the solder resist (not shown). Specifically speaking, the openings OP are formed by patterning utilizing a photolithography technique. When patterning accuracy of the openings OP is taken into consideration, if the notches NT are not a fixed distance (margin) away from the exposed regions EXR, the notches NT resultantly are formed in the exposed regions EXR due to pattern deviation. In order to reliably prevent the shape defect of the ground terminal composed of the exposed regions EXR, it is preferable to form the notches NT with a margin allowing for patterning accuracy of the openings OP.

In regard to this, the embodiment is configured to include the plurality of notches NT as shown, for example, in FIG. 13, and this configuration is useful in that it can readily expand leak paths without increasing the size of one notch NT, while preventing the shape defect of the ground terminal composed of the exposed regions EXR.

The second feature of the embodiment is that a slit SL is formed in the covered region CVR between the exposed regions EXR so as to extend toward the center of the back-surface ground pattern BGP as shown, for example, in FIG. 13. Forming the slit SL can provide a leak path for evaporated moisture in a center part of the back-surface ground pattern BGP where notches NT cannot be formed. Specifically, if a region overlapping with the region R2 of FIG. 12 in plan view is positioned at the center part of the back-surface ground pattern BGP, a leak path effective to the trapped evaporated moisture can be provided by forming a slit SL extending toward the center part of the back-surface ground pattern BGP. Therefore, it can be said that the second feature of the embodiment has important technical significance in that the slit SL can provide a leak path that cannot be served by the notches NT. As shown, for example, in FIG. 13, the notches NT and the slit SL formed so that they are connected to each other can expand leak paths for evaporated moisture, thereby effectively preventing delamination of the internal wiring layer L3. Thus, the first feature and the second feature can be combined in the embodiment as shown in FIG. 13, and the combination of the first feature and second feature generates a synergistic effect to further increase the reliability of the electronic device EA1.

From the viewpoint of preventing the shape defect of the ground terminal composed of the exposed regions EXR of the back-surface ground pattern BGP, it is preferable to form the slit SL so as not to extend into the exposed regions EXR, and also to form the slit SL by adding a margin from the exposed regions EXR to allow for the patterning accuracy.

The second feature of the embodiment also includes provision of a plurality of slits SL as shown, for example, in FIG. 13. Providing the plurality of slits SL is useful in that it can readily expand leak paths without increasing the size of a single slit SL, while preventing the shape defect of the ground terminal composed of the exposed regions EXR.

The third feature of the embodiment is that the region R2 is formed so as to connect to a side surface of the wiring board WB, as shown, for example, in FIG. 12, without being enclosed by the internal ground pattern IGP2. In this case, moisture evaporated in the region R2 is released toward the external space through the side surface of the wiring board WB. The release of the moisture can curb the internal pressure rise induced by the moisture trapped in the region R2, thereby preventing delamination of the internal terminal patterns TEP2 formed inside the region R2. The third feature of the embodiment is a technical idea to effectively use the side surface of the wiring board WB as a leak path. Thus, the third feature of the embodiment can provide another leak path in addition to the leak paths provided by the first and second features, thereby effectively preventing delamination of the internal wiring layer L3. In short, the combination of the first, second, and third features of the embodiment generates a synergistic effect to further increase the reliability of the electronic device EA1.

If the third feature of the embodiment is implemented, the internal ground pattern IGP2 is divided into the internal ground pattern IGP2a and the internal ground pattern IGP2b as shown, for example, in FIG. 12. In this configuration, as shown in FIG. 12, the internal ground pattern IGP2a is configured to couple to the through holes TH1a, and the internal ground pattern IGP2b is configured to couple to the through hole TH1c in this embodiment. According to the embodiment, the internal ground pattern IGP2a and internal ground pattern IGP2b, which are divided from each other, are electrically coupled to the internal ground pattern IGP1 shown in FIG. 11, independently. As a result, a ground potential can be applied to both the divided internal ground pattern IGP2a and internal ground pattern IGP2b.

First Modification

Figure 15:
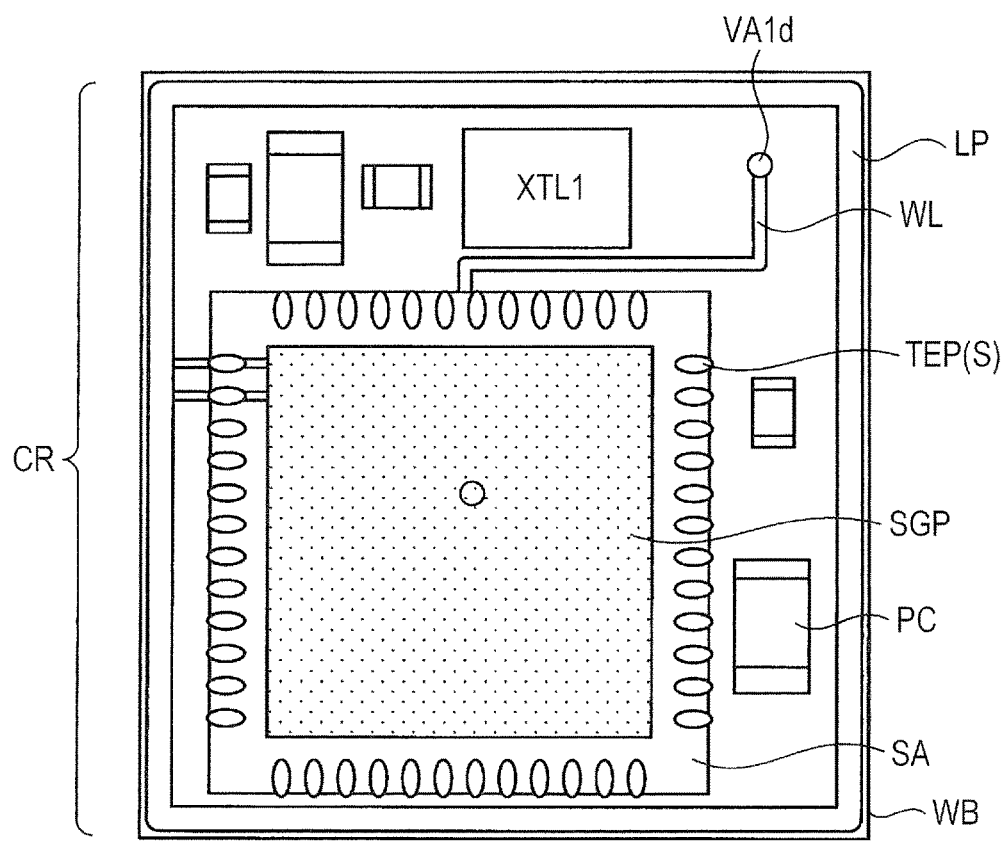
FIG. 15 schematically shows a plan layout configuration of a front surface wiring layer formed in a wiring board of an electronic device according to the first modification.

In the first modification, an example configuration of an electronic device with an antenna provided outside the electronic device will be described. FIG. 15 schematically shows a layout configuration of a front surface wiring layer L1 formed in a wiring board WB of the electronic device according to the first modification. The wiring board WB according to the first modification shown in FIG. 15 has a component mounting region CR, but does not have an antenna mounting region (AR). Since it is a precondition that the antenna is provided externally to the electronic device, the wiring board WB of the first modification does not need the antenna mounting region. As shown in FIG. 15, there is a wiring line WL in the component mounting region CR over the wiring board WB of the first modification, and an end of the wiring line WL is electrically coupled to a via VA1d. In addition, as shown in FIG. 15, the wiring board WB of the first modification includes a cap-mount land pattern LP formed continuously along an outer area of the component mounting region CR since there is no need to draw a wiring line WL to the antenna mounting region.

Figure 16:
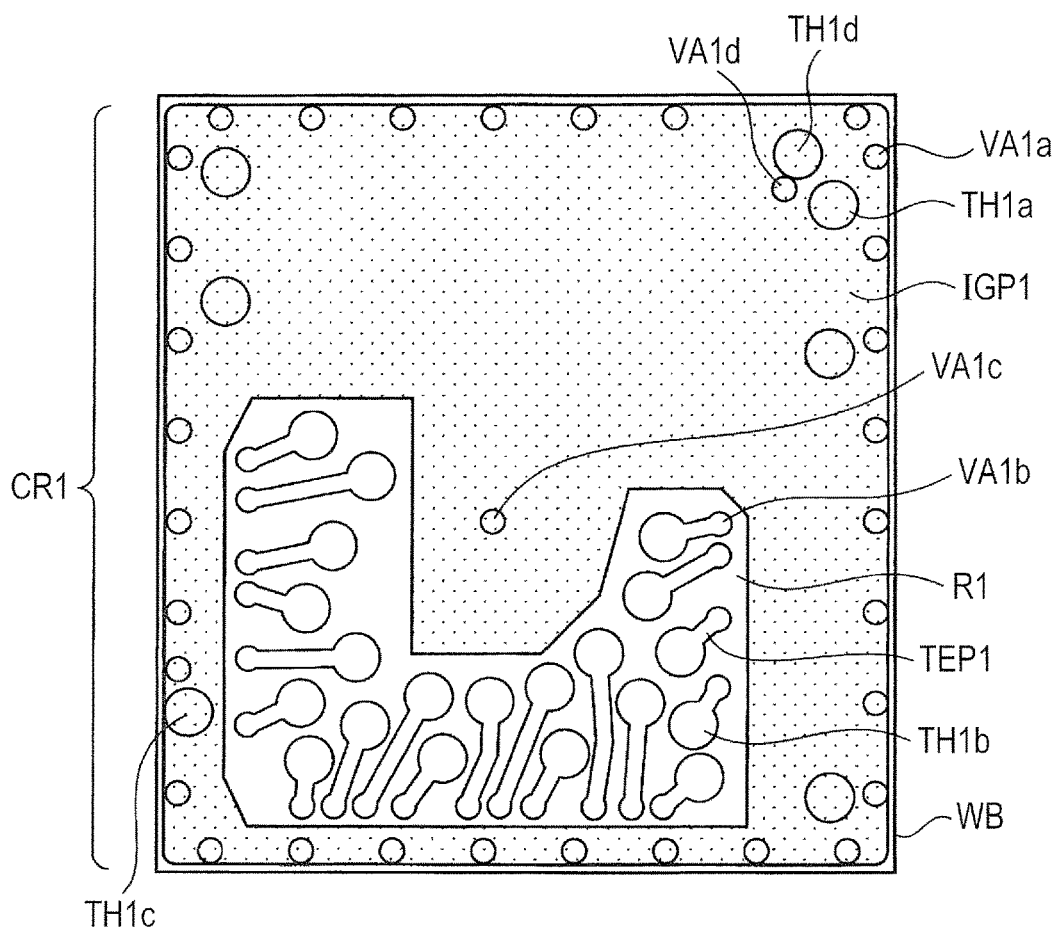
FIG. 16 schematically shows a plan layout configuration of a first internal wiring layer formed in the wiring board of the electronic device according to the first modification.

FIG. 16 schematically shows a layout configuration of an internal wiring layer L2 formed in the wiring board WB of the electronic device according to the first modification. As shown in FIG. 16, a through hole TH1d that is electrically coupled to the via VA1d is formed in the internal wiring layer L2 of the wiring board WB according to the first modification.

Figure 17:
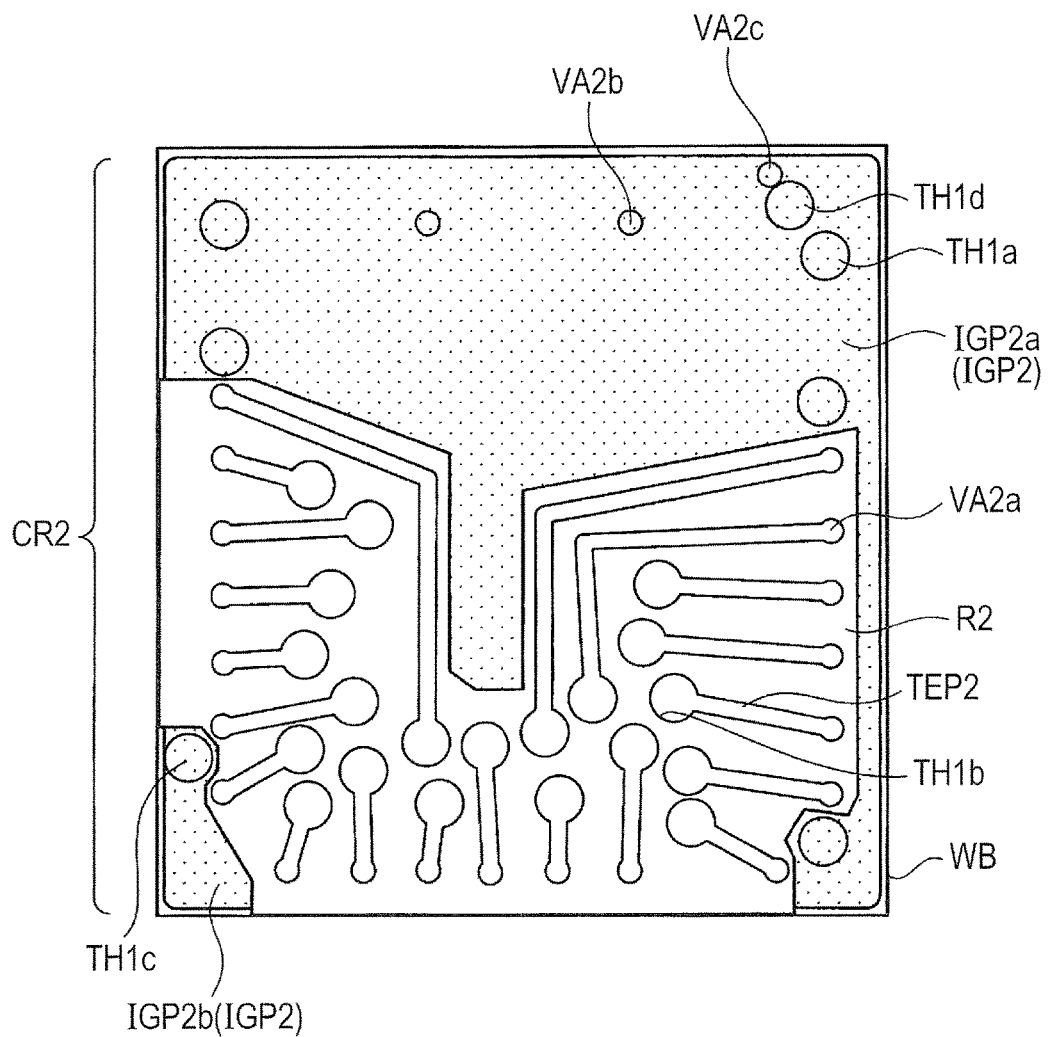
FIG. 17 schematically shows a plan layout configuration of a second internal wiring layer formed in the wiring board of the electronic device according to the first modification.

FIG. 17 schematically shows a layout configuration of an internal wiring layer L3 formed in the wiring board WB of the electronic device according to the first modification. As shown in FIG. 17, a via VA2c that is electrically coupled to the through hole TH1d is formed in the internal wiring layer L3 of the wiring board WB according to the first modification.

Figure 18:
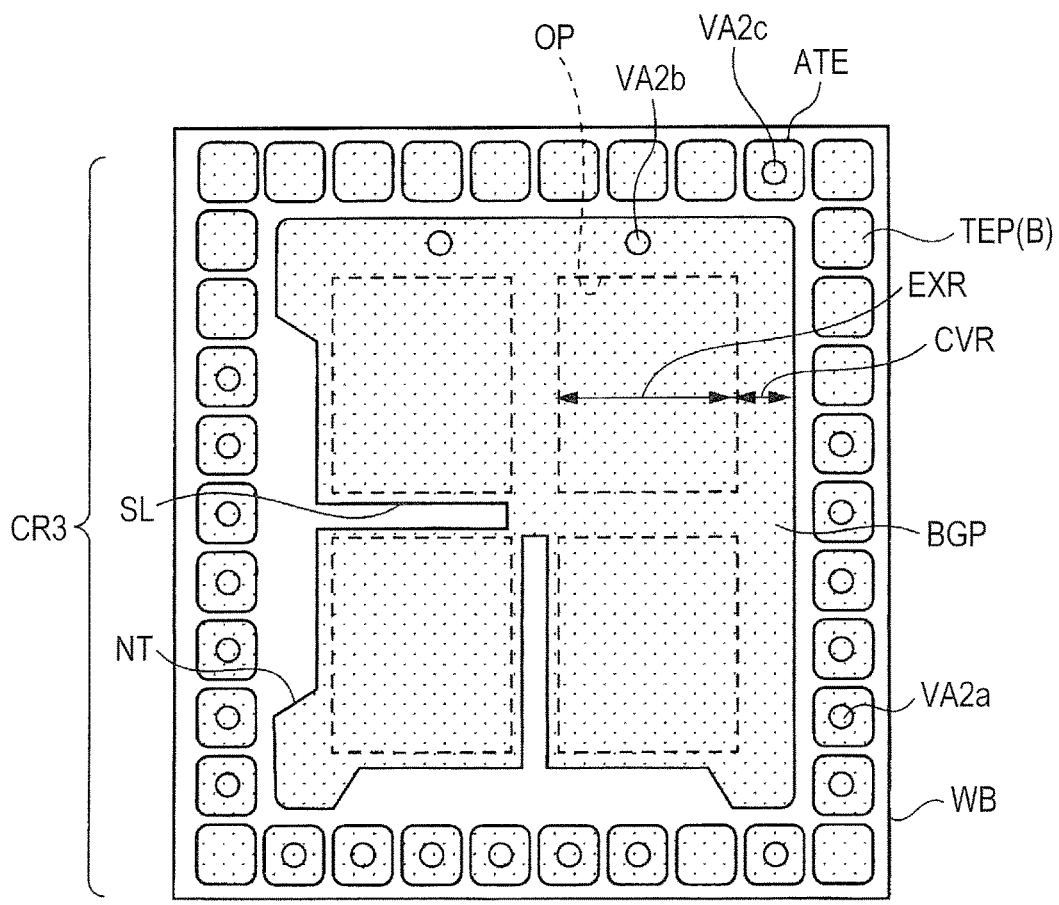
FIG. 18 shows a schematic plan layout configuration of a back surface wiring layer formed in the wiring board of the electronic device according to the first modification.

FIG. 18 schematically shows a layout configuration of a back surface wiring layer L4 formed in the wiring board WB of the electronic device according to the first modification.

As shown in FIG. 18, an antenna terminal ATE that is electrically coupled to the via VA2c is formed in the back surface wiring layer L4 of the wiring board WB according to the first modification. In other words, as shown in FIG. 18, a plurality of back-surface terminal patterns TEP(B) in the first modification include the antenna terminal ATE connectable to the antenna provided outside the electronic device. As shown from FIGS. 15 to 18, the antenna terminal ATE formed in the back surface wiring layer L4 is electrically coupled to the wiring line WL formed in the front surface wiring layer L1 through a path composed of the via VA2c, through hole TH1d, and via VA1d. In short, the wiring board WB of the first modification does not include an antenna, but includes the antenna terminal ATE connectable to an external antenna.

Figure 19:
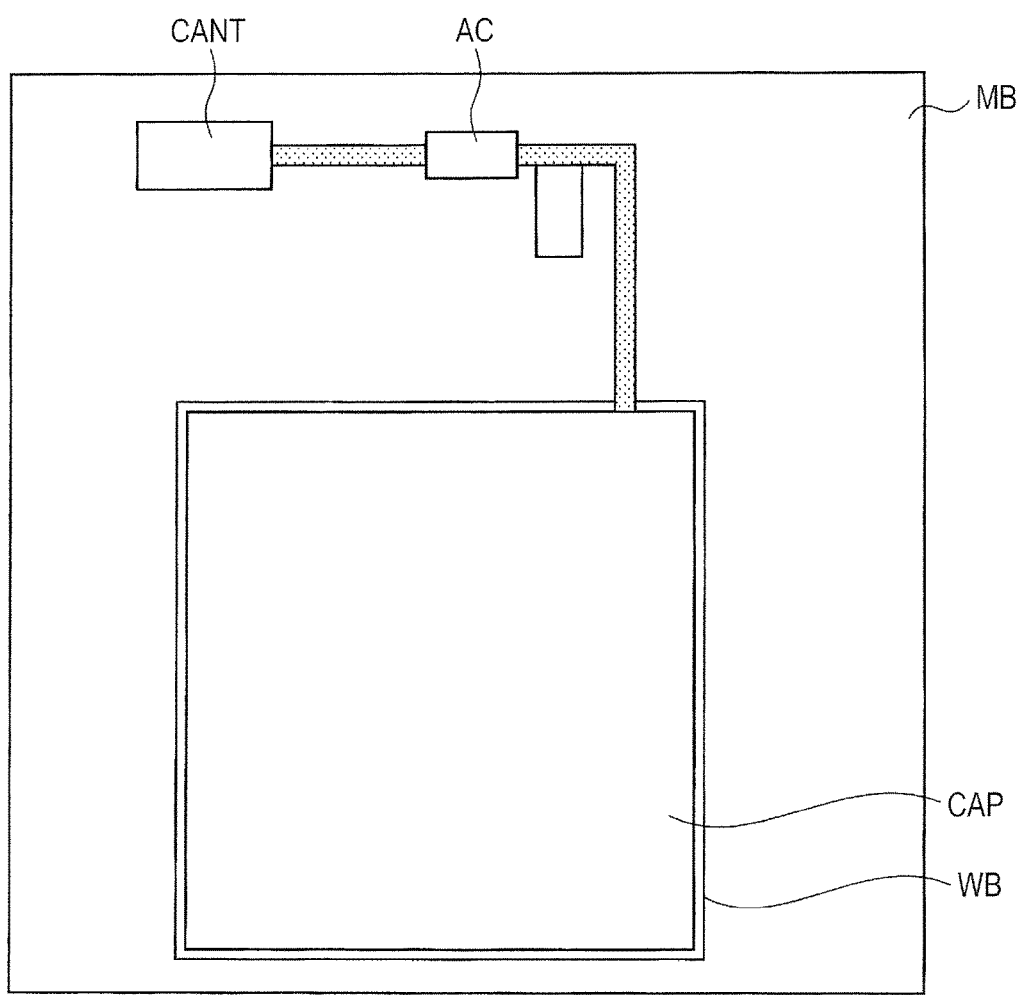
FIG. 19 illustrates an example coupling configuration between the wiring board and an antenna according to the first modification.

FIG. 19 is a schematic diagram showing an example coupling configuration between the wiring board WB and antenna according to the first modification. As shown in FIG. 19, a cap CAP is placed over the front surface of the wiring board WB of the first modification, and the wiring board WB is mounted on a mount board MB so that the back surface of the wiring board WB makes contact with the front surface of the mount board MB. FIG. 19 also shows a wiring line formed in the mount board MB, an impedance adjustment component AC electrically coupled to the wiring line, and a chip antenna CANT electrically coupled to the wiring line over the mount board MB. Through the coupling configuration, the wiring board WB is electrically coupled to the chip antenna CANT, which is externally provided outside the wiring board WB, over the mount board MB.

Figure 20C:
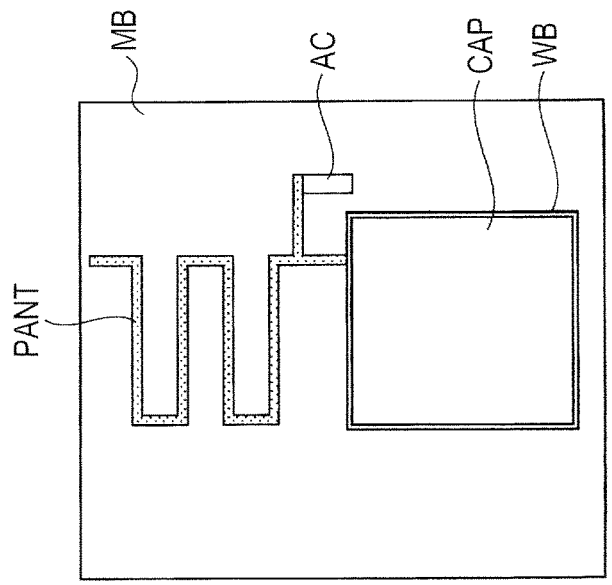
FIGS. 20A to 20C illustrate other examples of the coupling configuration between the wiring board and antenna according to the first modification.
Figure 20B:
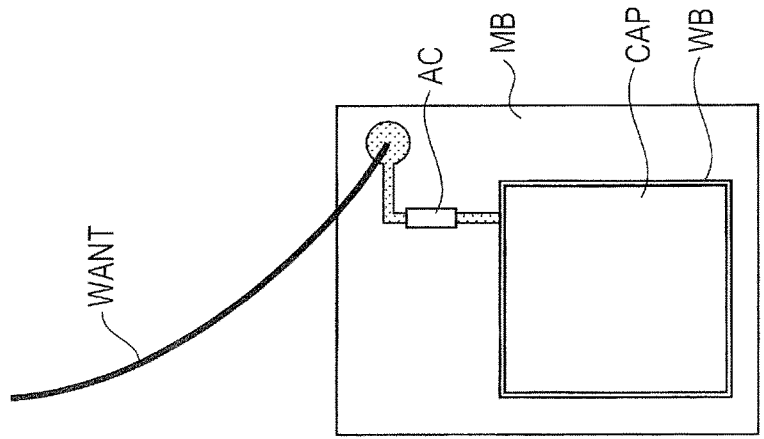
Figure 20A:
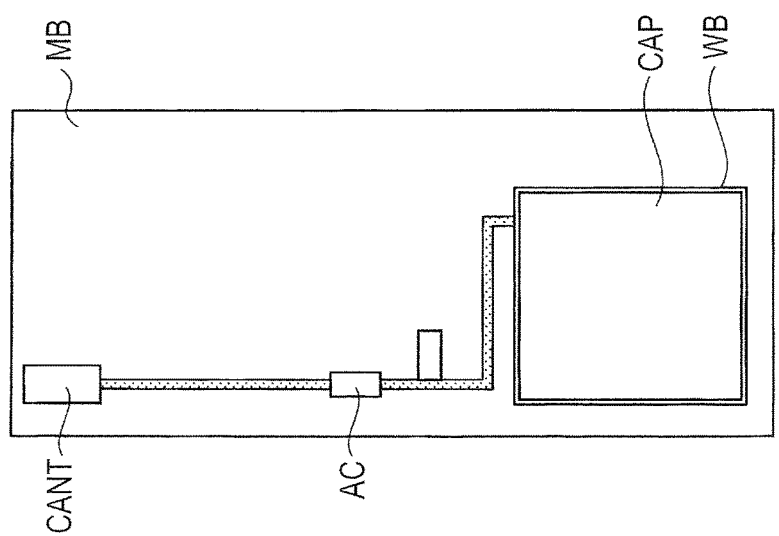

However, the coupling configuration between the wiring board WB of the first modification and the antenna provided outside the wiring board WB is not limited to the configuration shown in FIG. 19, and, for example, a layout configuration as shown in FIG. 20A is also available to electrically couple the wiring board WB to the chip antenna CANT. Furthermore, the coupling configuration between the wiring board WB and antenna is not limited to the layout configuration using a chip antenna, but, for example, a layout configuration using a wire antenna WANT as shown in FIG. 20B and a layout configuration using a pattern antenna PANT as shown in FIG. 20C are also feasible.

Advantages of the First Modification

As described above, the first modification is made on the precondition that the antenna is provided outside the wiring board WB, and therefore the wiring board WB can be downsized because the wiring board WB needs the component mounting region CR, but does not need to possess the antenna mounting region.

The wiring board WB of the first modification does not have the antenna mounting region, but is provided with the antenna terminal ATE (see FIG. 18) in the back surface thereof, and the antenna terminal ATE can electrically couple the antenna (chip antenna CANT, wire antenna WANT, or pattern antenna PANT) provided outside the wiring board WB to the wiring board as shown, for example, in FIG. 19 and FIGS. 20A to 20C. Thus, in the first modification, the antenna is not mounted over the wiring board WB, but the antenna terminal ATE is formed in the wiring board WB to allow the antenna, which is indispensable for the electronic device, to be provided outside the electronic device, and consequently increasing the flexibility in positioning the electronic device in a case and also increasing the degree of freedom in designing the case.

Furthermore, the cap-mount land pattern LP in the first modification can be formed continuously along the outer area of the component mounting region CR as shown, for example, in FIG. 15, and thereby improving sealing performance of the cap CAP that covers the component mounting region CR of the wiring board WB. With the improved sealing performance, it is possible to effectively prevent the entry of foreign matter and moisture to the component mounting region CR of the wiring board WB, while improving the shielding performance of the cap CAP. Accordingly, it can be said that the first modification increases the reliability as well as performance of the electronic device.

Second Modification

Figure 21:
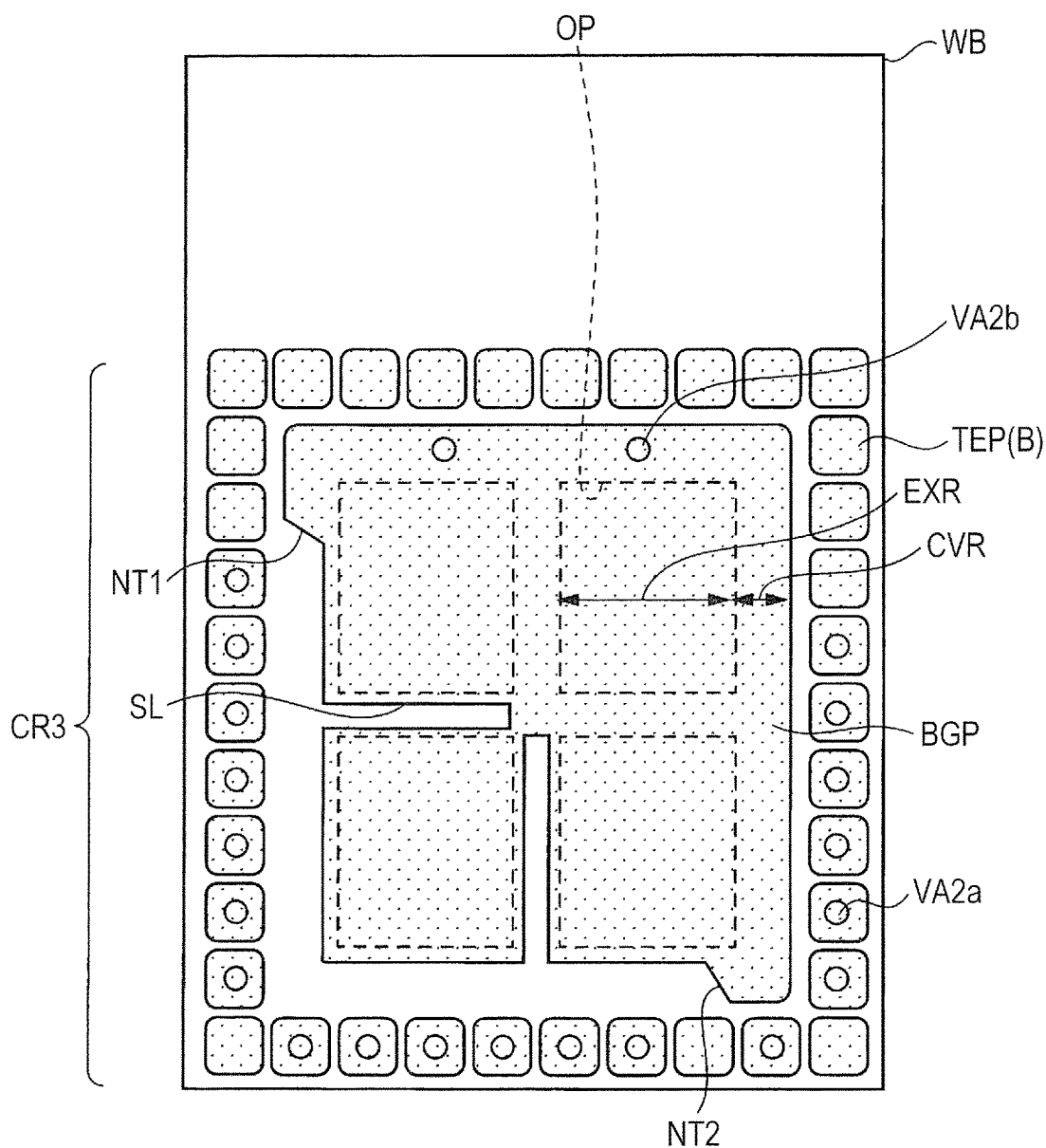
FIG. 21 illustrates an example configuration of a back-surface ground pattern according to the second modification.
Figure 22:
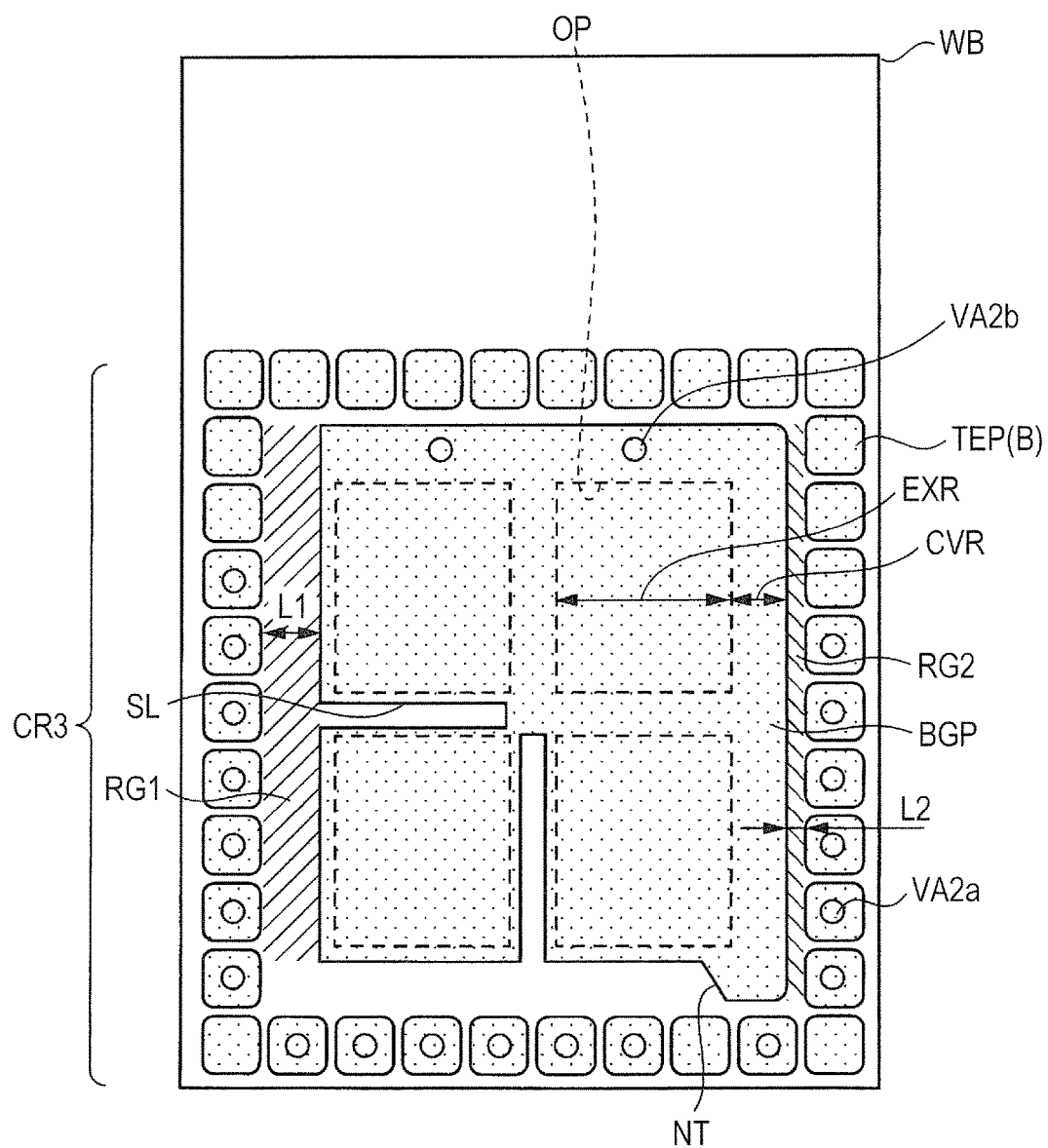
FIG. 22 illustrates another example configuration of the back-surface ground pattern according to the second modification.

It has been described in the embodiment that delamination of internal wiring layers can be prevented by forming notches NT and slits SL in the back-surface ground pattern BGP to form leak paths for moisture retained inside the wiring board WB as shown, for example, in FIG. 13; however, the technical idea of the embodiment is not limited to the configuration shown in FIG. 13. Specifically, the technical idea of the embodiment can be implemented, for example, by combining a plurality of notches NT (notch NT1 and notch NT2) into one as shown in FIG. 21, or with a notch NT that cannot be defined as a notch as shown in FIG. 22. For example, the configuration shown in FIG. 22 includes, in plan view, a region RG1 between a back-surface ground pattern BGP and a group of back-surface terminal patterns TEP(B), and the region RG1 has a distance L1 that is a distance (shortest distance) between the back-surface ground pattern BGP and the group of the back-surface terminal patterns TEP(B). In addition, the configuration shown in FIG. 22 also includes, in plan view, a region RG2 between the back-surface ground pattern BGP and another group of the back-surface terminal patterns TEP(B), and the region RG2 has a distance L2 that is a distance between the back-surface ground pattern BGP and the group of the back-surface terminals pattern TEP(B). The distance L2 is shorter than the distance L1. In the configuration shown in FIG. 22, in plan view, the region RG1 is formed so as to overlap with the region R2 (board-member exposed region) shown in FIG. 12. Consequently, the second modification configured as shown in FIG. 22 also can provide leak paths for moisture retained inside the wiring board WB, thereby preventing delamination of the internal wiring layers.

Third Modification

Figure 23:
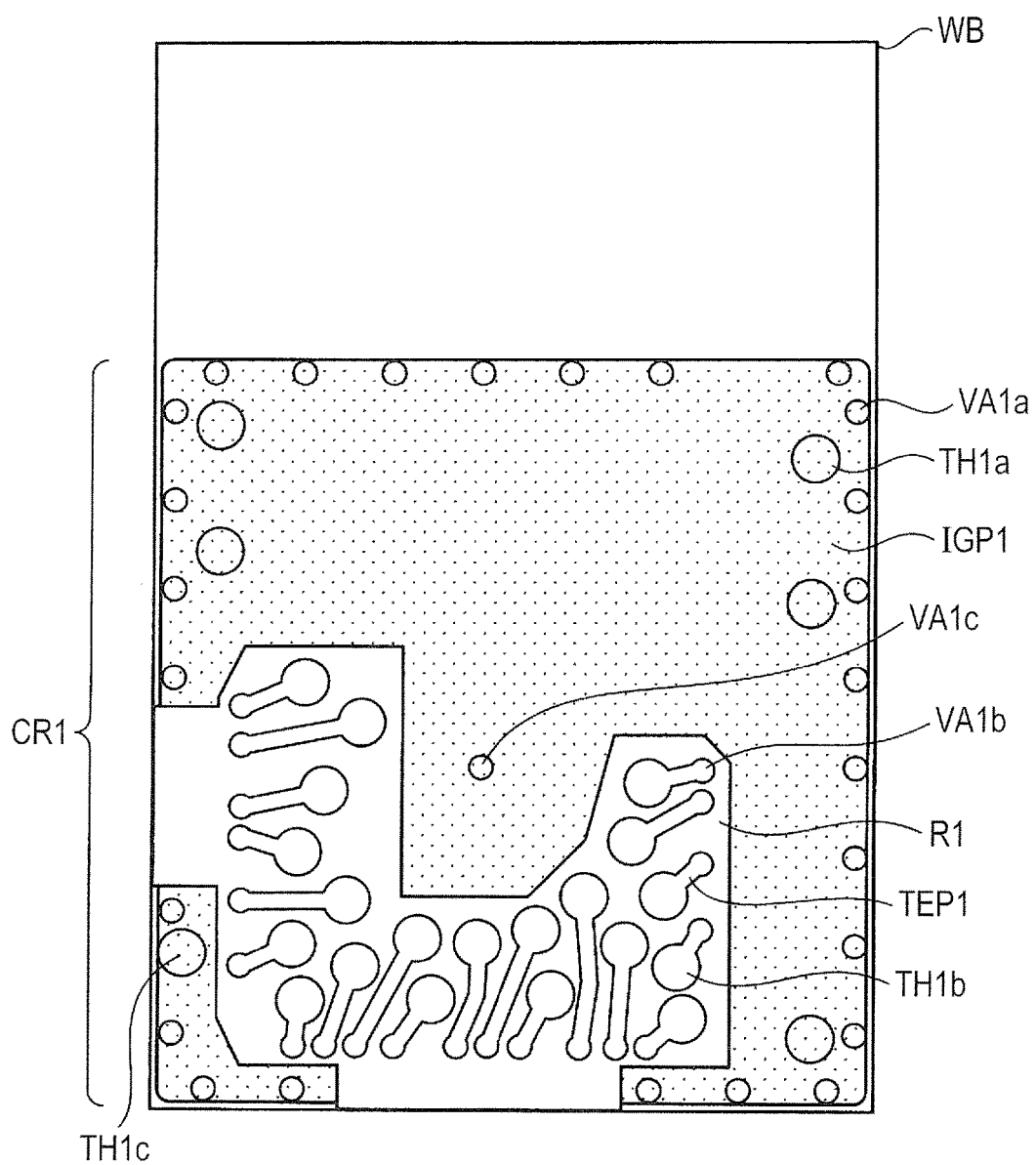
FIG. 23 is a plan view showing a schematic plan layout configuration of a first internal wiring layer according to the third modification.

It has been described in the embodiment about the layout configuration in which the region R2 of the internal wiring layer L3 is formed so as to connect to side surfaces of the wiring board WB rather than being enclosed by the internal ground pattern IGP2 as shown, for example, in FIG. 12; however, this technical idea is not limitedly applicable to the internal wiring layer L3, but can be applied to the region R1 of the internal wiring layer L2 as shown, for example, in FIG. 23. In this case, the moisture evaporated in the region R1 is also released toward the external space through side surfaces of the wiring board WB. The release of the moisture can curb the internal pressure rise induced by the moisture trapped in the region R1, thereby preventing delamination of the internal terminal patterns TEP1 formed inside the region R1. The third modification also adopts the technical idea to effectively utilize a side surface of the wiring board WB as a leak path.

As a result of utilizing a side surface of the wiring board WB as a leak path, delamination of the internal wiring layer L2 can be effectively prevented, thereby further increasing the reliability of the electronic device.

While the invention made by the present inventors has been described with reference to the foregoing embodiment, it goes without saying that the present invention is not limited to the embodiment and that various modifications can be made without departing from the gist of the invention.

The aforementioned embodiment includes the following configuration.

(Supplementary Note 1)

An electronic device functioning as a wireless communication unit comprising:
a wiring board having a front surface and a back surface; and
a semiconductor device mounted over the front surface of the wiring board,
wherein the wiring board includes
a front-surface wiring layer formed at the front surface,
an internal wiring layer formed inside the wiring board, and
a back-surface wiring layer formed at the back surface,
wherein the internal wiring layer includes
a board-member exposed region from which a board member is exposed, and
a first internal wide pattern enclosing the board-member exposed region,
wherein the back-surface wiring layer includes
a back-surface wide pattern, and
a plurality of back-surface terminal patterns formed away from and around the back-surface wide pattern,
wherein a first region is formed between the back-surface wide pattern and a group of the back-surface terminal patterns in plan view, and the first region has a first distance between the back-surface wide pattern and the group of the back-surface terminal patterns,
wherein a second region is formed between the back-surface wide pattern and another group of the back-surface terminal patterns in plan view, and the second region has a second distance between the back-surface wide pattern and the another group of the back-surface terminal patterns, and
wherein the first region overlaps with the board-member exposed region in plan view.

(Supplementary Note 2)

The electronic device according to supplementary note 2,
wherein the back-surface terminal patterns include an antenna terminal connectable to an antenna provided outside the electronic device.

(Supplementary Note 3)

An electronic device functioning as a wireless communication unit comprising:
a wiring board having a front surface and a back surface; and
a semiconductor device mounted over the front surface of the wiring board,
wherein the wiring board includes
a front-surface wiring layer formed at the front surface,
an internal wiring layer formed inside the wiring board, and
a back-surface wiring layer formed at the back surface,
wherein the internal wiring layer includes
a board-member exposed region from which the board member is exposed, and
an internal wide pattern divided into a plurality of parts by the board-member exposed region, and
wherein the board-member exposed region is connected to a side surface of the wiring board.

(Supplementary Note 4)

The electronic device according to supplementary note 3,
wherein the back-surface wiring layer includes
the back-surface wide pattern, and
a plurality of back-surface terminal patterns formed away from and around the back-surface wide pattern, and
wherein the back-surface terminal patterns include an antenna terminal connectable to an antenna provided outside the electronic device.

What is claimed is:

1. An electronic device functioning as a wireless communication unit comprising:
a wiring board having a front surface and a back surface; and
a semiconductor device mounted over the front surface of the wiring board,
wherein the wiring board includes
a front-surface wiring layer formed at the front surface,
an internal wiring layer formed inside the wiring board, and
a back-surface wiring layer formed at the back surface,
wherein the internal wiring layer includes
a first region from which a board member is exposed, and
a first internal wide pattern enclosing the first region,
wherein a back-surface wide pattern is formed in the back-surface wiring layer, and the back-surface wide pattern overlaps with the first region and the first internal wide pattern in plan view, and
wherein the back-surface wide pattern has a notch that overlaps with the first region in plan view.

2. The electronic device according to claim 1,
wherein the front surface of the wiring board includes
a component mounting region where the semiconductor device is mounted, and
an antenna mounting region where an antenna is mounted, adjacent to the component mounting region, and
wherein the first internal wide pattern and the back-surface wide pattern are formed at positions overlapping with the component mounting region in plan view.

3. The electronic device according to claim 2,
wherein the antenna is a monopole antenna.

4. The electronic device according to claim 1,
wherein the front surface of the wiring board has a component mounting region where the semiconductor device is mounted,
wherein a cap-mount land pattern is formed in the component mounting region so as to extend along an outer area of the component mounting region, and
wherein a cap is mounted over the front surface of the wiring board, the cap being coupled to the cap-mount land pattern and covering the semiconductor device.

5. The electronic device according to claim 4,
wherein the cap is made of a metal material.

6. The electronic device according to claim 1,
wherein the back-surface wide pattern includes
a covered region covered with an insulating film, and
a plurality of exposed regions exposed from the insulating film, and
wherein a slit is formed in the back-surface wide pattern, the slit being positioned in the covered region sandwiched by the exposed regions in plan view.

7. The electronic device according to claim 6,
wherein the slit is connected to the notch.

8. The electronic device according to claim 6,
wherein the covered region is positioned between the notch and the exposed regions.

9. The electronic device according to claim 6,
wherein the back-surface wide pattern has a plurality of slits.

10. The electronic device according to claim 1,
wherein the front surface of the wiring board has a component mounting region where the semiconductor device is mounted,
wherein the front-surface wiring layer within the component mounting region includes
  a front-surface wide pattern, and
  a plurality of front-surface terminal patterns formed away from and around the front-surface wide pattern, and
wherein the semiconductor device is mounted over the front surface of the wiring board so as to electrically couple to the front-surface wide pattern and each of the front-surface terminal patterns.

11. The electronic device according to claim 10,
wherein the internal wiring layer includes
  a first internal wiring layer located below the front-surface wiring layer, and
  a second internal wiring layer located below the first internal wiring layer,
wherein the first internal wiring layer includes
  the first region from which the board member is exposed, and
  the first internal wide pattern enclosing the first region,
wherein the second internal wiring layer includes
  a second region from which the board member is exposed, and
  a second internal wide pattern divided into a plurality of parts by the second region, and
wherein the second region is connected to a side surface of the wiring board.

12. The electronic device according to claim 11,
wherein the front-surface wide pattern and the first internal wide pattern are electrically coupled to each other,
wherein the first internal wide pattern is electrically coupled to each of the parts of the second internal wide pattern divided by the second region, and
wherein the second internal wide pattern and the back-surface wide pattern are electrically coupled to each other.

13. The electronic device according to claim 11,
wherein the back-surface wiring layer includes
  the back-surface wide pattern, and
  a plurality of back-surface terminal patterns formed away from and around the back-surface wide pattern,
wherein the first internal wiring layer within the first region has a plurality of first internal terminal patterns each electrically coupled to a corresponding front-surface terminal pattern,
wherein the second internal wiring layer within the second region has a plurality of second internal terminal patterns each electrically coupled to a corresponding first internal terminal pattern, and
wherein each second internal terminal pattern is electrically coupled to a corresponding back-surface terminal pattern.

14. The electronic device according to claim 1,
wherein the back-surface wide pattern has a plurality of notches.

15. The electronic device according to claim 1,
wherein the first internal wide pattern and the back-surface wide pattern are ground patterns to which a reference potential is supplied.

* * * * *